United States Patent [19]

Ideta et al.

[11] Patent Number: 5,444,388
[45] Date of Patent: Aug. 22, 1995

[54] APPARATUS FOR TESTING SEMICONDUCTOR DEVICES USING A CONDUCTIVE SHEET

[75] Inventors: Yasushi Ideta; Tsunenori Umezu; Akihiro Washitani, all of Kikuchi, Japan

[73] Assignee: Mitsubishi Denki Kabushiki Kaisha, Tokyo, Japan

[21] Appl. No.: 223,538

[22] Filed: Apr. 5, 1994

[30] Foreign Application Priority Data

Apr. 5, 1992 [JP] Japan .................................. 5-078224
Jul. 30, 1993 [JP] Japan .................................. 5-189787

[51] Int. Cl.⁶ ...................... G01R 31/00; G01R 31/02
[52] U.S. Cl. .................... 324/755; 324/72.5; 437/8; 29/825; 439/482; 333/246
[58] Field of Search ................ 324/758–772; 439/329–330, 482, 347, 74, 80–81, 77, 29, 32, 62; 437/8; 29/825

[56] References Cited

U.S. PATENT DOCUMENTS 4,987,365  1/1991  Shreeve et al. ................... 324/758
5,313,157  5/1994  Pasieczuik et al. ................ 324/757

FOREIGN PATENT DOCUMENTS 2223178  9/1990  Japan .
4206752  7/1992  Japan .

Primary Examiner—Kenneth A. Wieder
Assistant Examiner—Barry C. Bowser
Attorney, Agent, or Firm—Leydig, Voit & Mayer

[57] ABSTRACT

A semiconductor apparatus for functionally inspecting semiconductor devices is designed to prevent contact failure, deformation, and the like caused by solder transferred from external leads of semiconductor devices and deposited on contact terminals of the inspection apparatus. A sheet having metal-film patterns corresponding to an array of external leads of a semiconductor device is interposed between the external leads and the contact terminals to electrically connect the external leads to the contact terminals. The semiconductor device is inspected and the sheet is changed at a suitable time when it is contaminated with solder.

14 Claims, 17 Drawing Sheets

APPARATUS FOR TESTING SEMICONDUCTOR DEVICES USING A CONDUCTIVE SHEET

BACKGROUND OF THE INVENTION

1. Field of the Invention

This invention relates to a semiconductor inspection apparatus for inspecting functions and the like of surface-mount type semiconductor devices.

2. DESCRIPTION OF THE RELATED ART

FIG. 22 is a perspective view of an external appearance of a semiconductor inspection system 200 having a semiconductor inspection apparatus. The semiconductor system 200, called a handler, is arranged to perform function tests, such as a screening test and a burn-in test. The semiconductor inspection system 200 includes a supply unit 210 in which untasted semiconductor devices are accommodated, a measuring unit 220 for performing inspection, a storage unit 230 for accommodating inspected semiconductor devices. In the measuring unit 220, a chamber capable of changing the temperature and other conditions of an inspection atmosphere is formed. Therefore, these units are partitioned with walls (not shown), and only their portions through which semiconductor devices are transported are connected to each other.

FIG. 23 schematically shows the internal construction of the semiconductor inspection system 200 for explanation of the procedure of transporting semiconductor devices. When semiconductor devices are inspected, they are handled as units each consisting of a plurality of semiconductor devices mounted on pallets. The supply unit 210 contains unmeasured pallets 212 on which uninspected semiconductor devices are mounted, and unloaded pallets 213. Ordinarily, a group of 20 to 30 pallets laid on each other is input to the supply unit 210 through an openable portion 211 (see FIG. 22) on the front side at one time. Unloaded pallets are successively moved to an inner position for unloaded pallets 213. Each semiconductor device is moved from the position on the pallet 212 to one of catchers of a rotary transport mechanism 214 in an aerial transport manner, and is transported to the vicinity of a preliminary heating unit 221 of the inspection unit 220 by a rotary motion of the rotary transport mechanism 214.

The semiconductor device is then moved in an aerial transport manner to a catcher of the preliminary heating ring 221 in a position indicated at 221a. The preliminary heating ring 221 ordinarily has about twelve catchers on which semiconductor devices are mounted. The semiconductor device mounted at the position 221a undergoes preliminary heating for inspection while the ring 221 makes one revolution. The semiconductor device heated and returned to the position 221a is moved to a central socket frame 20 shown in FIG. 24 in an aerial transport manner.

Next, the Semiconductor device on the socket frame 20 is inspected while its leads are pressed against contact terminals located below the leads by a movable pressing device 30 shown in FIG. 24. After being inspected, the semiconductor device is moved to a recovery table 232 from the socket frame 20 in an aerial transport manner. According to the result of inspection, in the storage unit 230, the semiconductor device is moved in an aerial transport manner onto a defective storage pallet 233 if it is defective or onto a non-defective storage pallet 234 if it is non-defective. Unloaded pallets 235 are successively moved to and superposed on non-defective storage pallets 234 as the non-defective storage pallets 234 are fully loaded. When a certain number of pallets 233 and 234 on which inspected semiconductor devices are mounted are collected, they are taken out through the openable portion 231 (see FIG. 22) of the storage unit 230.

The aerial transport in the above-described transport process is performed with an aerial transport mechanism (not shown) which takes up each semiconductor device by, for example, vacuum to transport the semiconductor device. Each of the supply unit 210, the measuring unit 220 and the storage unit 230 has several aerial transport mechanisms. Each of the supply unit 210 and the storage unit 230 further has a lift mechanism (not shown) for gradually moving superposed pallets in a vertical direction.

FIG. 24 is a perspective view of a conventional semiconductor inspection apparatus 1 which is provided in the measuring unit 220 shown in FIG. 23, and with which inspection of semiconductor devices is practiced. The semiconductor inspection apparatus 1 is formed of the socket frame 20 and the movable pressing device 30. The socket frame 20 is fixed on, for example, a board-like member (not shown), while the movable pressing device 30 is connected to, for example, an actuator such as a cylinder or motor (not shown) and is movable in a vertical direction on the socket frame 20. A semiconductor device 100, i.e., a tested article, has a package 101 in which a semiconductor chip (not shown) is embedded and a plurality of external leads 102 extending out of the package 101. The leads 102 have mounted surfaces which are brought into contact with electrode pads on a printed circuit board or the like (not shown) when the semiconductor device 700 is mounted on the printed circuit board. On the socket frame 20 are provided contact terminals 40 arranged with the same pitch as the external leads 102 of the semiconductor device 100. The socket frame 20 has guides 21 for positioning the package 101 of the semiconductor device 100 so that the external leads 102 correctly contact the corresponding contact terminals 40. The guides 21 are provided on four corner portions of the socket frame 20. The contact terminals 40 are illustrated in FIG. 24 as if they are exposed, although they are actually provided in guide grooves 22 shown in FIGS. 25 and 26. The movable pressing device 30 has a lead pressing potion 31 with which the external leads 102 of the semiconductor device 100 mounted on the socket frame are pressed against the contact terminals 40, a block 32 to which the lead pressing portion 31 is attached, and a drive shaft connected to a cylinder or the like for moving the movable pressing device 30 in a vertical direction. In a state where the semiconductor device 100 is placed on the socket frame 20 and where the external leads 702 are pressed against the contact terminals 40 by the movable pressing device 30, inspection tests of the semiconductor device, i.e., a screening test, a burn-in test and the like, are performed.

FIG. 25 is a cross-sectional view showing a state of inspection in which the semiconductor device 100 is placed on the socket frame 20 and the external leads 102 are pressed against the contact terminals 40 by the pressing device 30. FIG. 26 is an enlarged partially fragmentary perspective view showing a state in which the external leads 102 of the semiconductor device 100 and the connection terminals 40 contact each other. Each of the contact terminals 40 provided on the socket frame 20 has a contact portion 41 which contacts the corresponding one of the external leads 102, a curved portion 42 which enables the contact portion 41 to elastically contact the external leads with a suitable contact pressure, and an electrode portion 43 connected to an external inspection measurement circuit (not shown), and a contact surface 44 (see FIG. 25) which contacts the mounted surface 104 of the external lead 102. As illustrated, the contact terminals 40 are set in the guide grooves 22 that position and guide the contact terminals 40. In FIG. 26, an outer portion of the socket frame 20 is cut way to show the relationship between the guide grooves 22 and the contact terminals 40.

The operation of the inspection apparatus will be described below. Electrical characteristics of semiconductor devices 100 to be tested are measured under a temperature condition of −50° to +125° C. in the chamber of the measuring unit 220 shown in FIG. 22 while being maintained in the state shown in FIG. 25.

The external leads 102 arranged to have their mounted surfaces 104 brought into contact with the contact surfaces 44 of the contact terminals 40 which are formed of a metal and which are elastic and good conductors are pressed by the lead pressing portion 31 of the pressing device 30 with a predetermined pressure. Each contact terminal 40 is formed of a metal, e.g., beryllium copper or phosphor bronze. The pressing device 30 is formed of a heat resistant insulating material such as quartz, sapphire, polyimideamide, MC nylon, polyether sulfone or the like. The predetermined pressure with which the external leads 102 are pressed is at least greater than a value obtained by multiplying the elastic force by the number of contact terminals 40. Pressing is performed with an actuator (not shown) such as a cylinder or a motor attached to the drive shaft 33. By this pressing and by virtue of the elasticity of the curved portions 42 of the contact terminals 40, a reaction against the pressure downwardly applied is caused and the larger contact pressure (of 10 to 10 g/pin, for example) is maintained between the external leads 102 and the contact terminals 40 by this reaction, thereby enabling semiconductor devices 100 to be inspected. Inspection tests are successively made with respect to semiconductor devices 100 successively mounted on the socket frame 20 provided in the measuring unit 220 of the semiconductor inspection system 200.

In the conventional semiconductor inspection apparatus thus arranged, the contact terminals provided on the socket frame are formed of metallic members having an elasticity while the surfaces of the external leads of tested semiconductor devices are processed by solder dipping or solder plating for the purpose of facilitating mounting on a printed circuit board. If such contact terminals and external lead surfaces are repeatedly brought into contact and pressed against each other in a temperature environment of −50° to +125° C. solder 103 on the mounted surfaces 104 is transferred to the contact surfaces 44 of the contact terminals 40 and is attached to and deposited on these surfaces. This problem will be described in more detail. U-shaped curved portions 42 are formed in the contact terminals 40 to make the same elastic. Therefore, the contact surfaces 44 of the contact terminals move in the direction of arrow A shown in FIG. 28 in such a manner as to scrape off solder 103 from the mounted surfaces 104 of the external leads 102 each time the mounted surfaces 104 are brought into contact with and pressed against the contact surfaces 44. Solder 103 is attached to and deposited on the contact surfaces 44 if such a movement is repeated. The solder deposited in this manner is oxidized, causing electrical contact failure and is reversely transferred to the external leads to cause a short circuit between adjacent external leads. Also, the solder may fall upon being separated and cause electrical and mechanical failures or deform the mounted surfaces 104 of the external leads, which must have a certain degree of flatness. It is therefore necessary to frequently clean or change the contact terminals.

Also, semiconductor devices having external leads arranged with a small pitch (of 0.5 mm or smaller) have been developed. It is difficult to provide contact terminals on the socket frame with such a small pitch, and the structure of the conventional inspection apparatus is difficult to adapt to inspect semiconductor devices having finer external leads.

SUMMARY OF THE INVENTION

In view of these problems, an object of the present invention is to provide a semiconductor inspection apparatus for maintaining a normal contact state by a simpler operation without cleaning or changing the contact terminals on the socket frame, and which can be adapted to semiconductor devices having finely-arranged external leads.

To achieve this object, according to one aspect of the present invention, there is provided an apparatus for inspecting semiconductor devices comprising a socket frame on which each semiconductor device is supported, and on which an array of contact terminals corresponding to an array of external leads of the semiconductor device and connected to an inspection measurement circuit are provided, a movable pressing device for pressing the external leads of the semiconductor device supported on the socket toward the contact terminals, and a changeable thin-film conductive sheet having an array of a plurality of conductor patterns for electrical connection between the external leads of the semiconductor device and the contact terminals on the socket frame, the thin-film conductive sheet being interposed between the contact terminals and the external leads during inspection as a protective sheet for preventing solder on the external leads from attaching to and depositing on the contact terminals.

In the semiconductor device inspection apparatus, according to another aspect of the present invention, the conductor patterns of the thin-film conductive sheet are formed of first metal film patterns arranged with a pitch equal to a pitch of the array of external leads of the semiconductor device, second metal film patterns arranged with a pitch equal to a pitch of the array of contact terminals, and metal film extension patterns connecting the first and second metal film patterns, whereby the thin-film conductive sheet can be adapted for an array of external leads of the semiconductor device and an array of contact terminals on the socket frame differing other in position and pitch.

In the semiconductor device inspection apparatus, according to yet another aspect of the present invention, the thin-film conductive sheet is a lengthwise sheet, and a sprocket mechanism for automatically changing a used portion of the sheet by a feed operation is further provided.

In the semiconductor device inspection apparatus, according to still another aspect of the present invention, wires are embedded in the lengthwise thin-film conductive sheet to improve the mechanical strength of the sheet.

According to a further aspect of the invention, there is provided an apparatus for inspecting semiconductor devices comprising a socket frame to which each semiconductor device is fixed, and on which an array of contact terminals corresponding to an array of external leads of the semiconductor device and connected to an inspection measurement circuit are provided, a changeable lengthwise thin-film conductive sheet having a plurality of conductor patterns for making electrical connections between the external leads of the semiconductor device and the contact terminals on the socket frame, the thin-film conductive sheet being interposed between the contact terminals and the external leads during inspection as a protective sheet for preventing solder on the external leads from attaching to and depositing on the contact terminals, positioning recognition marks on the thin-film conductive sheet for positioning relative to the semiconductor device, a sprocket mechanism for automatically changing the lengthwise thin-film conductive sheet in a feed operation, a manipulator for moving the semiconductor device to a position above the thin-film conductive sheet on the socket frame in an aerial transport manner by attracting the semiconductor device to its head portion, for positioning the semiconductor device on the thin-film conductive sheet, pressing the external leads of the semiconductor device toward the contact terminals during inspection, and for removing the semiconductor device from the thin-film conductive sheet in an aerial transport manner by attracting the semiconductor device to the head portion after inspection, at least one positioning sensor attached to the head portion of the manipulator to take an image of each of the positioning recognition marks on the thin-film conductive sheet, and a control unit for driving the sprocket mechanism to feed and change the thin-film conductive sheet on the basis of signals from the positioning sensor and the inspection measurement circuit each time the number of inspection times counted from the signal from the measurement circuit becomes equal to a predetermined number, and for driving the manipulator to position the semiconductor device on the thin-film conductive sheet on the basis of the signal from the positioning sensor.

According to a still further aspect of the invention, there is provided an apparatus for inspecting semiconductor devices comprising a socket frame to which each semiconductor device is attracted and fixed, and on which an array of contact terminals corresponding to an array of external leads of the semiconductor device and connected to an inspection measurement circuit are provided, a changeable lengthwise thin-film conductive sheet having a plurality of conductor patterns for making electrical connection between the external leads of the semiconductor device and the contact terminals on the socket frame, the thin-film conductive sheet being interposed between the contact terminals and the external leads during inspection as a protective sheet for preventing solder on the external leads from attaching to and depositing on the contact terminals, positioning recognition marks on the thin-film conductive sheet for positioning with the semiconductor device, sheet change designation marks in portions of the conductor patterns of the thin-film conductive sheet which the external leads of the semiconductor device contact, each sheet change designation mark having a surface profile having smaller recesses and projections which can disappear gradually as the solder from the external leads is attached to and deposited thereon, a sprocket mechanism for automatically changing the lengthwise thin-film conductive sheet in a feed operation, a manipulator for moving the semiconductor device to a position above the thin-film conductive sheet on the socket frame in an aerial transport manner by attracting the semiconductor device to its head portion, for positioning the semiconductor device on the thin-film conductive sheet, pressing the external leads of the semiconductor device toward the contact terminals during inspection, and for removing the semiconductor device from the thin-film conductive sheet in an aerial transport manner by attracting the semiconductor device to the head portion after inspection, at least one positioning sensor attached to the head portion of the manipulator to take images of each of the positioning recognition marks and the sheet change designation marks on the thin-film conductive sheet, and a control unit for driving the sprocket mechanism to feed and change the thin-film conductive sheet on the basis of a signal from the positioning sensor when the sheet change designation marks become unrecognizable, and for driving the manipulator to position the semiconductor device on the thin-film conductive sheet on the basis of the position of the positioning recognition marks.

In the semiconductor inspection apparatus provided in the first aspect of the invention, the external leads of the semiconductor device and the connection terminals on the socket frame connected to an inspection measurement circuit are connected to each other through a thin-film conductive sheet having conductor patterns extending through a thin-film insulating sheet between two surfaces of the same. Therefore, the external leads are not brought into direct contact with the contact terminals, and there is no possibility of the solder on the external leads attaching to the contact terminals. It is therefore possible to solve the problems of contact failure, a deformation of the external leads and the like due to the solder transferred from the external leads by changing the thin-film conductive sheet at a suitable time.

In the semiconductor inspection apparatus provided in the second aspect of the invention, if the array of external leads of the semiconductor device and the array of contact terminals on the socket frame differ from each other in position and pitch, a thin-film conductive pattern is used which has two groups of metal film patterns corresponding respectively to the external leads and the contact terminals, and metal film extension patterns which connect the two groups of metal film patterns. The external lead pitch can be increased on the contact terminal side in this manner, and the apparatus can be adapted for inspection of semiconductor devices having external leads of, for example, a smaller pitch.

In the semiconductor inspection apparatus provided in the third aspect of the invention, a mechanism for automatically changing the thin-film conductive sheet is provided to improve the operation efficiency.

In the semiconductor inspection apparatus provided in the fourth aspect of the invention, wires are embedded in the thin-film conductive sheet to improve the mechanical strength of the sheet.

In the semiconductor inspection apparatus provided in the fifth aspect of the invention, a positioning sensor for taking an image of the recognition marks provided on the thin-film conductive sheet for positioning of the semiconductor device relative to the thin-film conductive sheet is provided on the head portion of the manipulator for performing aerial transport, positioning on the thin-film conductive sheet and pressing during inspection of the semiconductor device by attracting the semiconductor device to the head portion. The manipulator is arranged to position the semiconductor device on the basis of the position of the positioning recognition marks. After the semiconductor device has been positioned on the thin-film conductive sheet on the socket frame, it is attracted to and fixed on the socket frame. Therefore, the semiconductor device can be positioned on the thin-film conductive sheet with improved accuracy and can be prevented from being shifted from the correct position after positioning.

In the semiconductor inspection apparatus provided in the sixth aspect of the invention on the basis of the apparatus in the fifth aspect, sheet change designation marks having a surface profile with smaller recesses and projections which can disappear gradually as the solder from the external leads is attached to and deposited thereon are further formed in portions of the conductor patterns of the thin-film conductive sheet which the external leads of the semiconductor device contact. An image of the sheet change designation marks is also input by the positioning sensor, while the manipulator is driven to position the semiconductor device on the thin-film conductive sheet on the basis of the position of the positioning recognition marks. When the sheet change designation marks become unrecognizable with the sensor, the sprocket mechanism is driven to feed and change the thin-film conductive sheet, thereby enabling the sheet to be changed in a more suitable condition.

DESCRIPTION OF THE PREFERRED EMBODIMENTS

Embodiment 1

Figure 22:
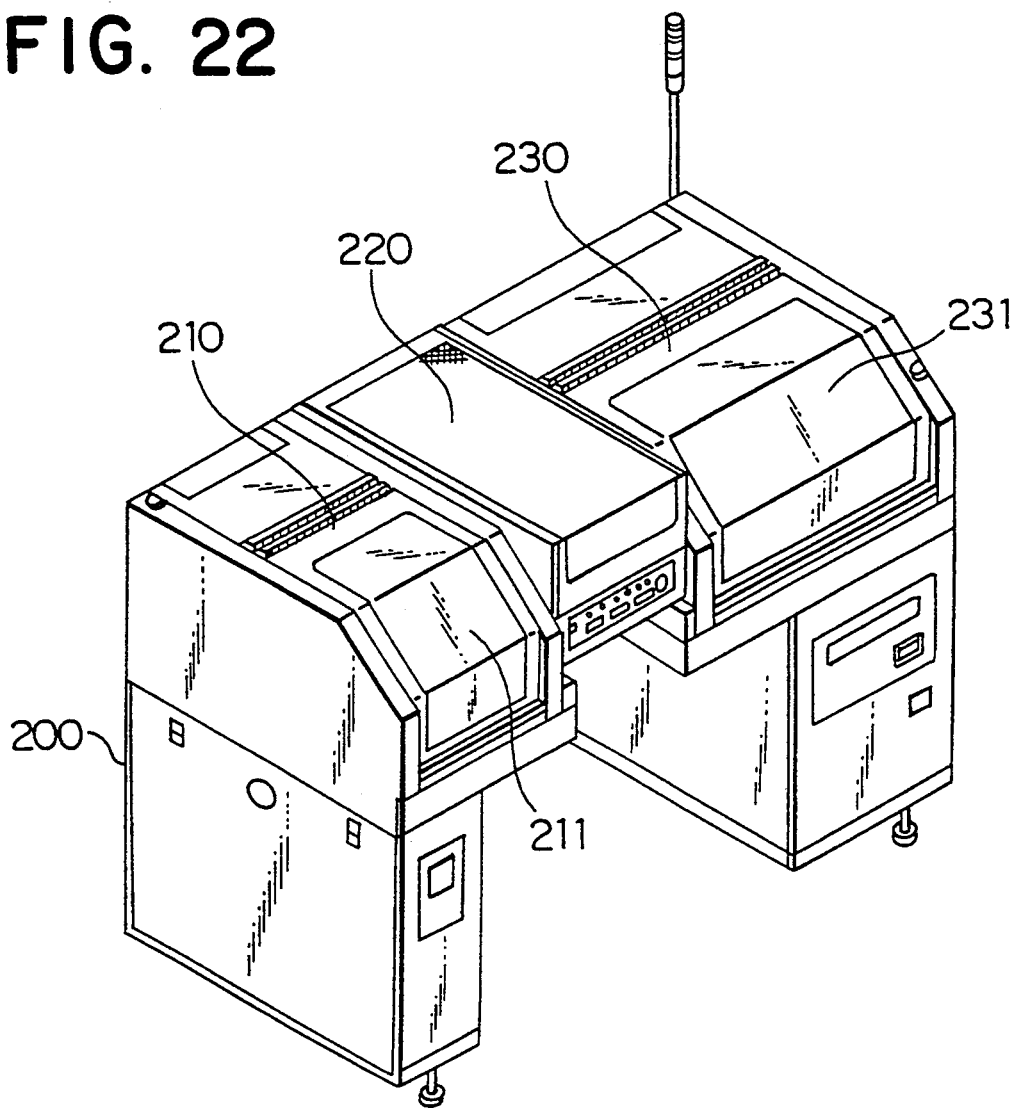
FIG. 22 is a perspective view of an overall external appearance of a semiconductor inspection system in which this kind of semiconductor inspection apparatus is incorporated.

The construction of a semiconductor inspection system having a semiconductor inspection apparatus in accordance with the present invention is basically the same as that of the conventional system shown in FIG. 22.

Figure 1:
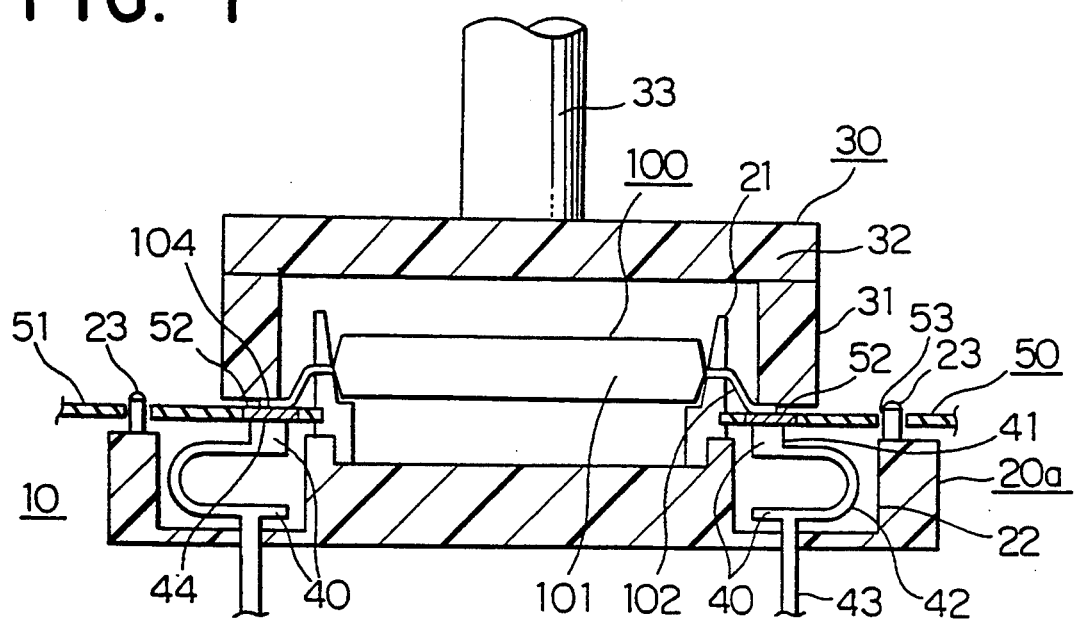
FIG. 1 is a cross-sectional view of a semiconductor inspection apparatus in accordance with a first embodiment of the present invention.
Figure 2:
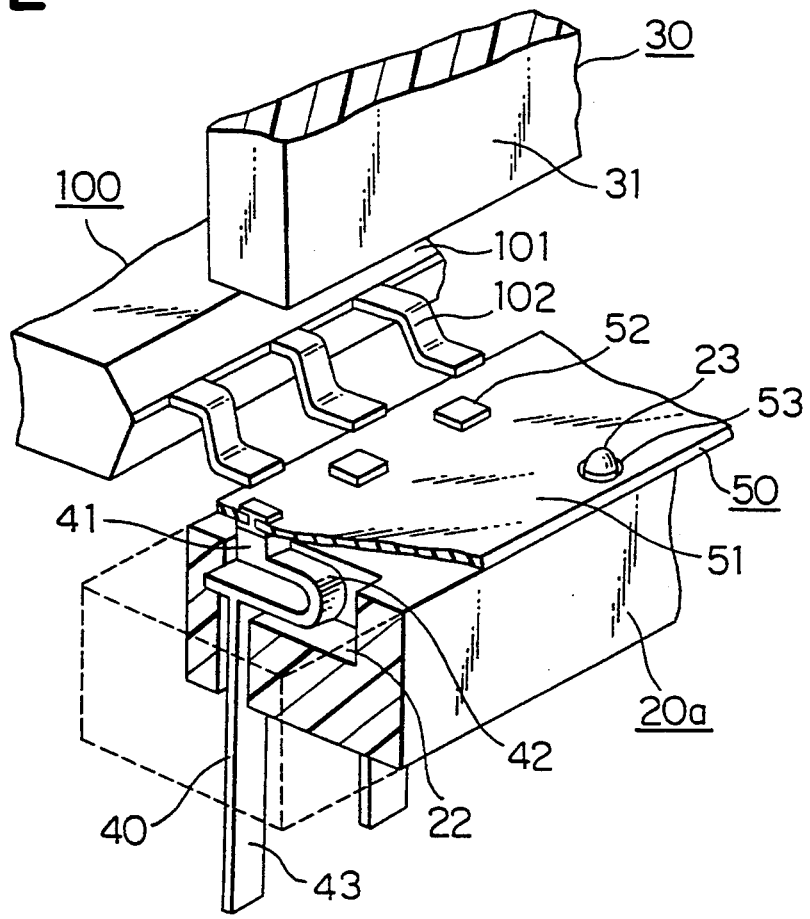
FIG. 2 is an enlarged perspective view of connected portions of contact terminals and external leads in the semiconductor inspection apparatus shown in FIG. 1.

FIG. 1 is a cross-sectional view of a semiconductor inspection apparatus in accordance with an embodiment of the present invention in a state of performing inspection. FIG. 2 is a partial enlarged perspective view of connected portions of contact terminals and external leads of a semiconductor device in the inspection apparatus shown in FIG. 1. In FIG. 2, portions of the device and the apparatus are shown fragmentarily to illustrate the state of the contact terminals. Components of this embodiment corresponding or identical to those in conventional arrangement are indicated by the same reference characters. As illustrated, the semiconductor inspection apparatus 10 has a socket frame 20a, a movable pressing device 30, and a thin-film conductive sheet 50 laid on the socket frame 20a. The socket frame 20a is fixed, for example, on a board-like member (not shown). The movable pressing device 30 is connected to, for example, an actuator such as a cylinder or motor (not shown) and is movable in a vertical direction on the socket frame 20a. A semiconductor device 100 is inspected in a state where the semiconductor device 100 is placed on the socket frame 20a on which the thin conductive sheet 50 is laid, and where a predetermined pressing force is applied to external leads 102 of the semiconductor device 100 by the movable pressing device 30.

On the socket frame 20a are provided contact terminals 40 which are arranged so as to be able to contact the external leads 102 of the semiconductor device 100. Electrode portions 43 of the contact terminals 40 are respectively connected to an inspection measurement circuit (not shown). The socket frame 20a has guides 21 for positioning a package 101 of the semiconductor device 100 so that the external leads 102 correctly contact the corresponding contact terminals 40. The guides 21 are provided on four corner portions of the socket frame 20a. The socket frame 20a also has guide grooves positioning and guiding the contact terminals 40, and positioning pins 23 for positioning the thin-film conductive sheet 50.

Figure 3:
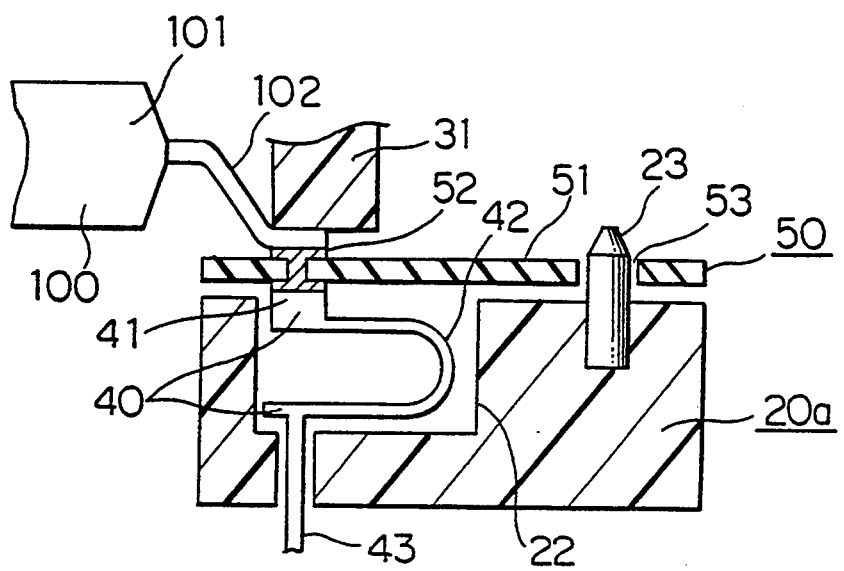
FIG. 3 is an enlarged cross-sectional view of connected portions of contact terminals and external leads in the semiconductor inspection apparatus shown in FIG. 1.

As is also shown in FIG. 3 by being enlarged, the thin-film conductive sheet 50 is a thin-film insulating sheet 51. Metal film patterns 52, i.e., conductor patterns, have a portion passing through the thin-film insulating sheet 51 in the thickness direction and other portions on obverse and reverse surfaces of the thin-film insulating sheet 51. The metal film patterns 52 are arranged with the same pitch as that of the external leads 102 and face the contact terminals 40 and the external leads 102. Positioning holes 53 in the thin-film conductive sheet 50 face the positioning pins 23 provided on the socket frame 20a.

The movable pressing device 30 has the same structure as that of the above-described conventional movable pressing device, and has a lead pressing portion 31, a block 32 to which the lead pressing portion 31 is attached, and a drive shaft connected to a cylinder or the like for moving the movable pressing device 30 in a vertical direction.

Figure 4:
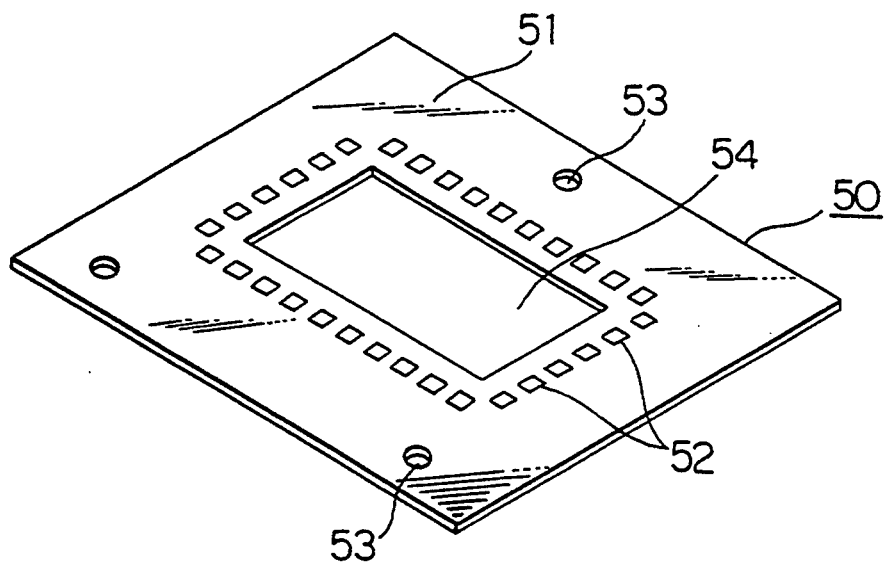
FIG. 4 is a perspective view of an example of a thin-film conductive sheet for a quad flat package (QFP) type semiconductor device used in the first embodiment.
Figure 5:
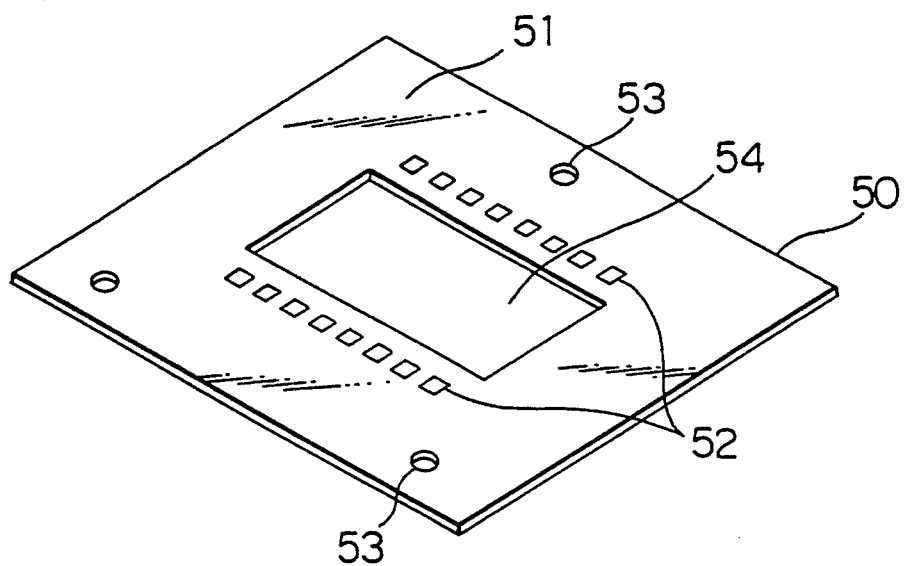
FIG. 5 is a perspective view of an example of a thin-film conductive sheet for a small outline package (SOP) type semiconductor device used in the first embodiment.
Figure 6:
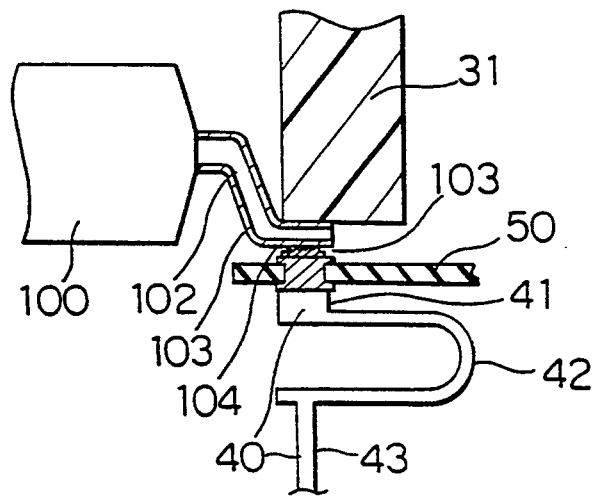
FIG. 6 is a cross-sectional view of the apparatus of FIG. 1, showing a state in which solder is attached to and deposited on the thin-film conductive sheet.

FIG. 3 is an enlarged cross-sectional view of portions of the external leads of the semiconductor device and the contact terminals connected to each other through the thin-film conductive sheet in the inspection apparatus shown in FIG. 1. FIG. 4 shows in perspective a thin-film conductive sheet for semiconductor devices of a quad flat package (QFP) type or the like having external leads extending from four sides, and FIG. 5 shows in perspective a thin-film conductive sheet for semiconductor devices of a small outline package (SOP) type or the like having external leads extending from two sides. As shown in FIGS. 4 and 5, an aperture 54 through which guides 21 and other members of the socket frame 20a for supporting the semiconductor device 100 are passed is formed in a central portion of each thin-film conductive sheet 50. In the thin-film conductive sheet 50 for semiconductor devices having external leads extending from four sides as shown in FIG. 4, metal film patterns 52 passing through the insulating sheet 51 are arranged along four sides of the aperture 54. In the thin-film conductive sheet 50 for semiconductor devices having external leads extending from two sides, similar metal film patterns 52 are arranged along two sides of the aperture 54.

The thin-film conductive sheet 50 includes a metal film patterns 52 of a metal such as Au, Ag, Al, Cu, a Cu alloy, W, Ti, Ni or an Ni alloy having a suitable conductivity on thin-film insulating sheet 51 made of a heat resistant material such as polyimide or glass epoxy and having a thickness of 10 to 200 $\mu$m. In this embodiment, each metal film pattern 52 includes a through hole with pads respectively on the obverse and reverse surfaces of the sheet 50, as shown in FIG. 3. The thickness of the pad portion of the metallic pattern 52 is about 30 to 50 $\mu$m, The operation of this embodiment will now be described. The basic operation and temperature environment setting and the like of this embodiment are the same as the above-described conventional art and, therefore, will not be specially described.

Figure 28:
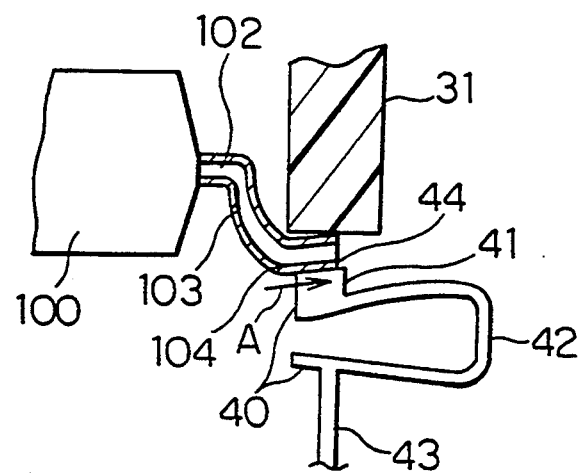
FIG. 28 is a cross-sectional view of the semiconductor inspection apparatus of FIG. 24, illustrating a state in which the contact terminals are scraping off solder from the external leads.

The thin film conductive sheet 50 is placed on the socket frame 20a so that the array of metal film patterns 52 coincides with the array of contact terminals 40. The semiconductor device 100 is then on the placed thin-film conductive sheet 50 by being brought thereto along the guides 21 provided on the socket frame 20a. In this state, the mounted surfaces 104 of the external leads 102, the metal film patterns 52 and the contact surfaces 44 of the contact terminals 40 are aligned. Thereafter, a predetermined pressure is downwardly applied to the external leads 102 by the movable pressing device 30. A reaction is thereby caused in the reverse direction by virtue of the elasticity of the curved portions 42 of the contact terminals 40. By this reaction, the external leads 702 and the contact terminals 40 are electrically connected to each other through the metal film patterns 52 with a predetermined contact pressure, thereby enabling the semiconductor device 100 to undergo predetermined inspection tests. When the inspection of one semiconductor device 100 is completed, the inspected semiconductor device 100 is replaced with the next semiconductor device 100, and the inspection is performed successively. During the process of repeating the inspection, the metal film patterns 52 of the thin-film conductive sheet 50 and the mounted surfaces 104 of the external leads 102 of the semiconductor devices 100 are repeatedly brought into contact with and pressed against each other, and solder 103 on the mounted surfaces of the external leads 102 is scraped off by the metal film patterns 52 in the same manner as between the external leads and the contact terminals described with reference to FIG. 28. The solder is transferred and attached to the surfaces of the metal film patterns 52 of the thin-film conductive sheet 50 in contact with the external leads 102.

In this embodiment, however, it is possible to continue the inspection while of maintaining the normal contact only by replacing the thin-film conductive sheet 50 to which solder 103 is attached with a new sheet. Therefore, there is no need for the troublesome operation of cleaning the contact terminals on the socket frame to which the solder has been transferred by using a brush or changing the contact terminals as in the conventional process i.e., the same operations except replacing the thin-film conductive sheet 50. It is therefore possible to improve the operation efficiency as well as to prevent a contact failure and a deformation of the mounted surfaces 104 of the external leads 102 due to the solder transferred from the external leads 102.

Embodiment 2

An inspection apparatus used in a case where an array of external leads of a semiconductor device and an array of contact terminals of a socket frame match with each other in position and pitch was described as an embodiment of the present invention. Another embodiment of the present invention in which an array of external leads and an array of contact terminals differ from each other in position and pitch will be described below.

Figure 7:
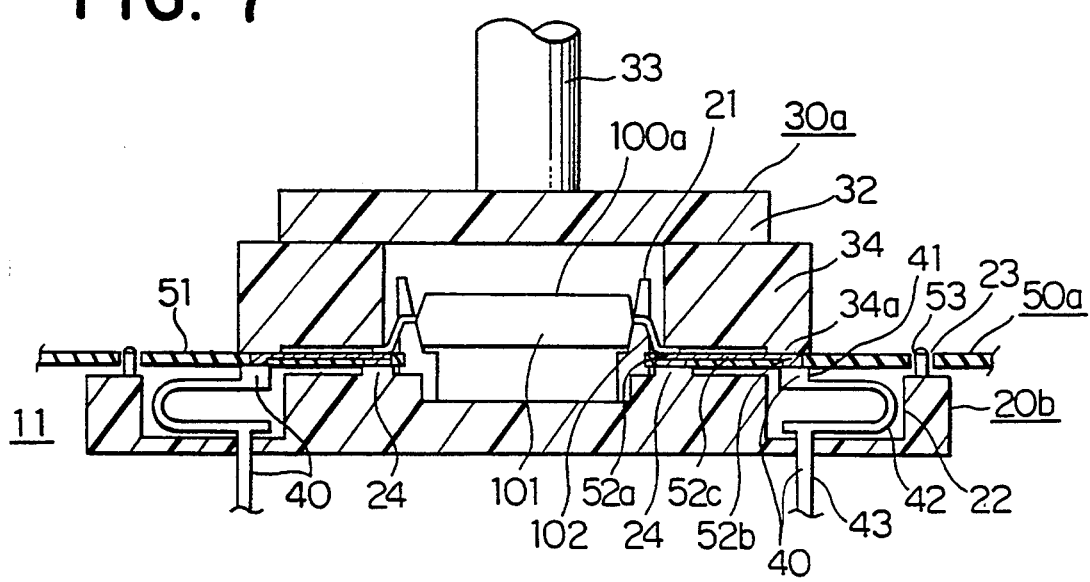
FIG. 7 is a cross-sectional view of a semiconductor inspection apparatus in accordance with a second embodiment of the present invention.
Figure 8:
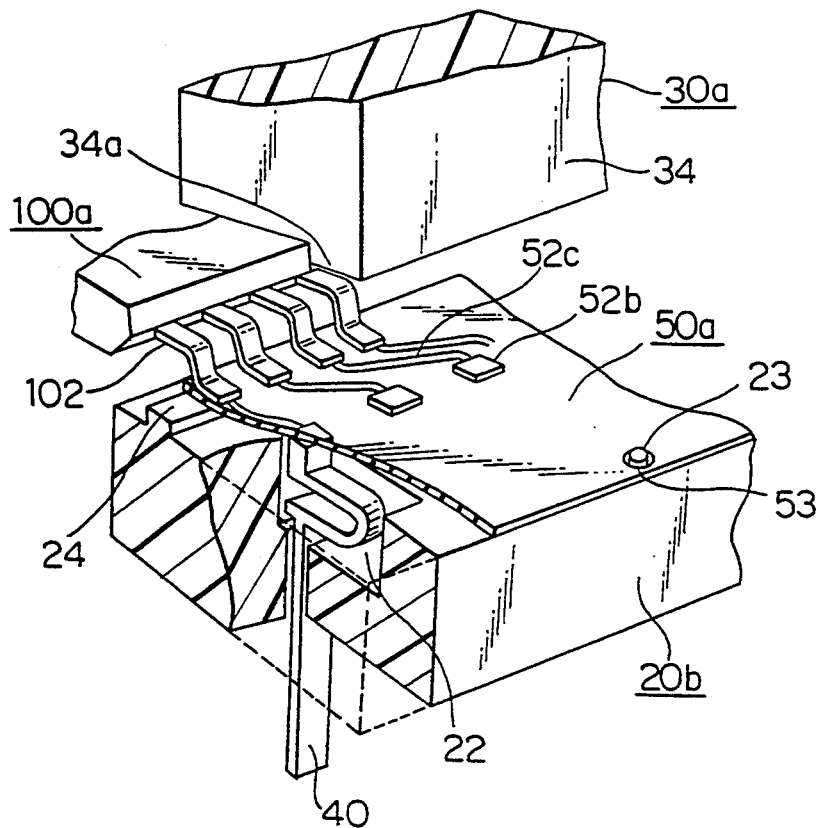
FIG. 8 is an enlarged perspective view of connected portions of contact terminals and external leads in the semiconductor inspection apparatus shown in FIG. 7.
Figure 9:
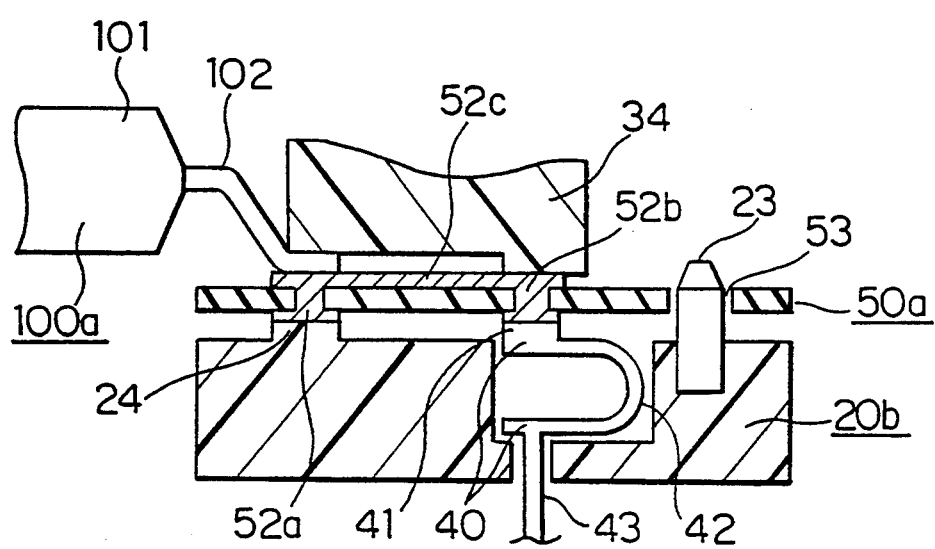
FIG. 9 is an enlarged cross-sectional view of connected portions of contact terminals and external leads in the semiconductor inspection apparatus shown in FIG. 7.
Figure 10:
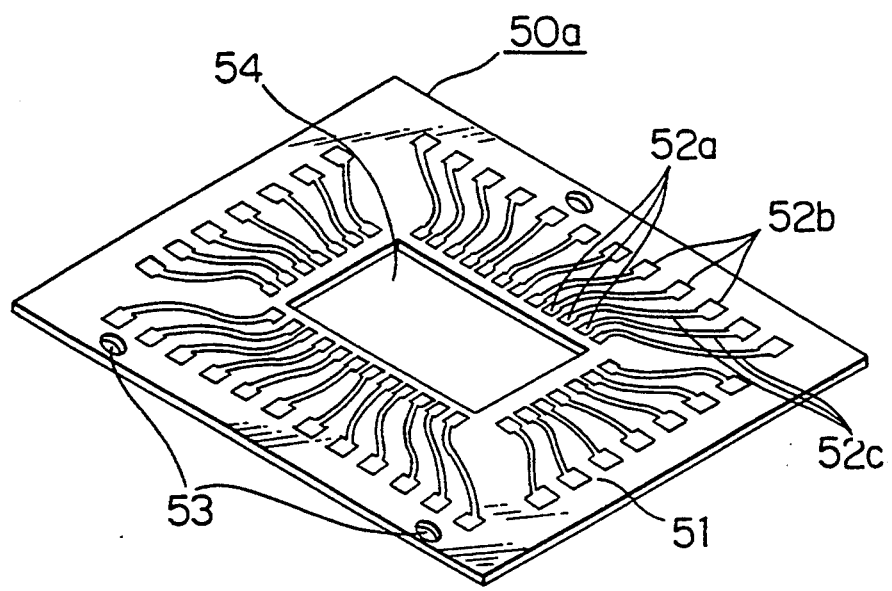
FIG. 10 is a perspective view of an example of a thin-film conductive sheet for a QFP type semiconductor device used in the second embodiment.
Figure 11:
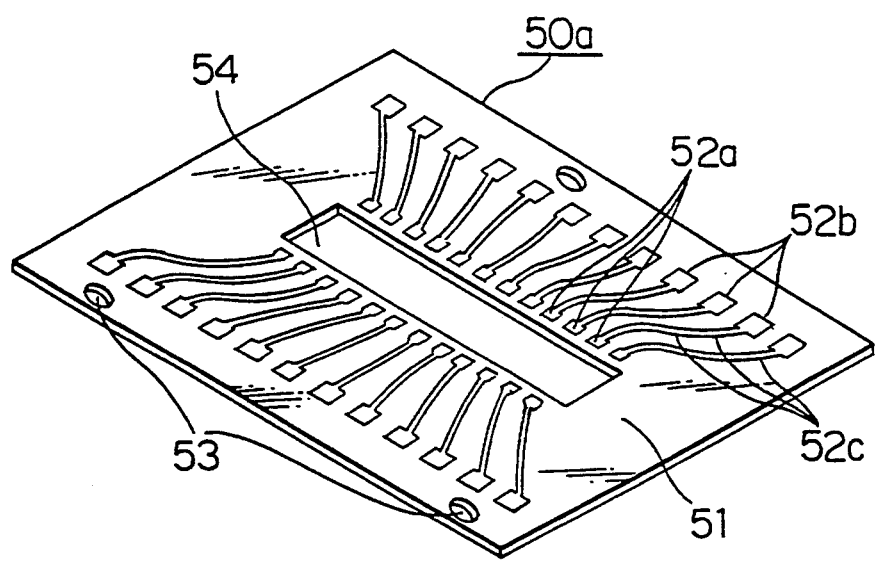
FIG. 11 is a perspective view of an example of a thin-film conductive sheet for a SOP type semiconductor device used in the second embodiment.

FIG. 7 is a cross-sectional view of a semiconductor inspection apparatus in accordance with the second embodiment of the present invention. FIG. 8 is an enlarged perspective view of connected portions of external leads of a semiconductor device and contact terminals in the inspection apparatus shown in FIG. 7, and FIG. 9 is an enlarged cross-sectional view of portions of the external leads of the semiconductor device and the contact terminals connected to each other through a thin-film conductive sheet in the inspection apparatus shown in FIG. 7. Further, FIG. 10 is a perspective view of a thin-film conductive sheet used in this embodiment for semiconductor devices of the QFP type or the like having external leads extending from four side surfaces, and FIG. 11 is a perspective view of a thin-film conductive sheet used in this embodiment for semiconductor devices of the SOP type or the like having external leads extending from two side surfaces. The inspection apparatus 11 of this embodiment can be applied to inspection of a semiconductor device 100a having external leads 102 arranged with a very small pitch.

In this embodiment, the semiconductor inspection apparatus 11 has a socket frame 20b, a movable pressing device 30a, and a thin-film conductive sheet 50a laid on the socket frame 20b. On the thin-film conductive sheet 50a, metal film patterns 52a and 52b and metal film extension patterns 52c are provided as conductor patterns. The metal film patterns 52a are formed on the thin-film conductive sheet 50a so as to match, in position and pitch, with the external leads 102 of the semiconductor device 100a. The metal film patterns 52b are formed with the same pitch and in the same positions as those of the contact terminals 40 matching with the external leads 102 in position and pitch. The metal film extension patterns 52c are formed so as to connect the metal film patterns 52a and 52b. In this embodiment, the metal film extension patterns 52c have an increased pitch larger than the fine pitch of the external leads 702 of the semiconductor device 100a to electrically connect the external leads 102 to the contact terminals 40 arranged with the same increased pitch. It is therefore possible to inspect semiconductor devices having external leads arranged with a very small pitch, which cannot be easily inspected if the above-described conventional socket structure is used, as well as to achieve the effect of Embodiment 1.

In this embodiment, a projection 34a is required which is formed on the lead pressing portion 34 of the movable pressing device 30a so as to extend along the array of the contact terminals 40, and which pressure the metal film patterns 52a on the contact terminal side 40 along with the external leads 102 of the semiconductor device 100a. A receiving base 24 which is formed on the socket frame 20b just below the external leads 702 is also required.

This embodiment has been described on the assumption that the semiconductor device has external leads arranged with a very small pitch. Needless to say, this embodiment can be applied to inspection of any semiconductor devices having external leads differing from the contact terminals of the socket frame in position and pitch.

In the above-described embodiments, a single thin-film conductive sheet such as that shown in FIG. 4 or 10 is used. However, any other thin-film conductive sheets may be used. For example, a continuous thin-film conductive sheet may be used in which, as described below with reference to FIG. 14, a plurality of groups of conductor patterns, each group consisting of those groups described above with respect to Embodiments 1 and 2 are regularly arranged. Such a continuous thin-film conductive sheet is used by being shifted to an extent corresponding to one group of conductor patterns at a time, if the used conductor patterns are contaminated with solder.

Embodiment 3

No mechanism for changing the thin-film conductive sheet was described with respect to the above-described embodiments. The thin-film conductive sheet may be changed manually in the above-described embodiments. A third embodiment of the present invention having an automatic sheet changing means for changing a thin-film conductive sheet will be described below.

Figure 12:
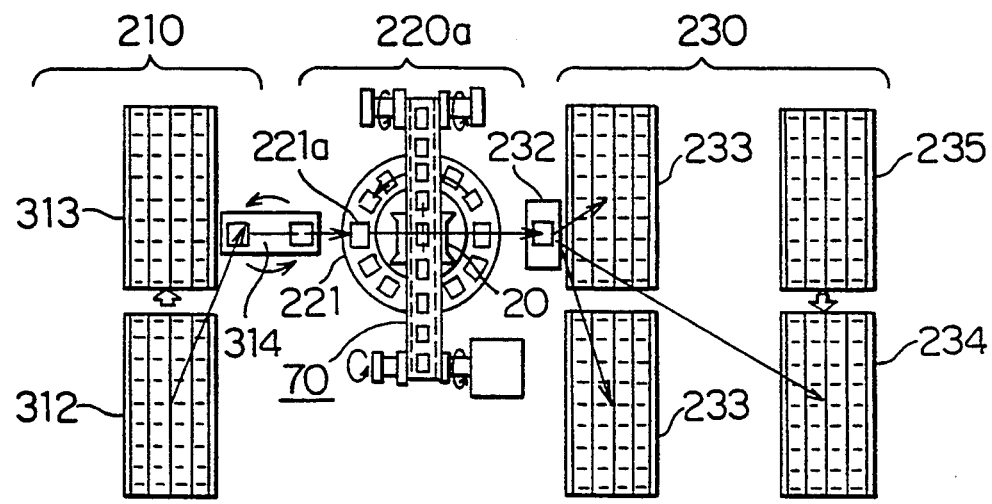
FIG. 12 is schematic diagram of the internal construction of a semiconductor inspection system having a semiconductor inspection apparatus in accordance with a third embodiment of the present invention.
Figure 23:
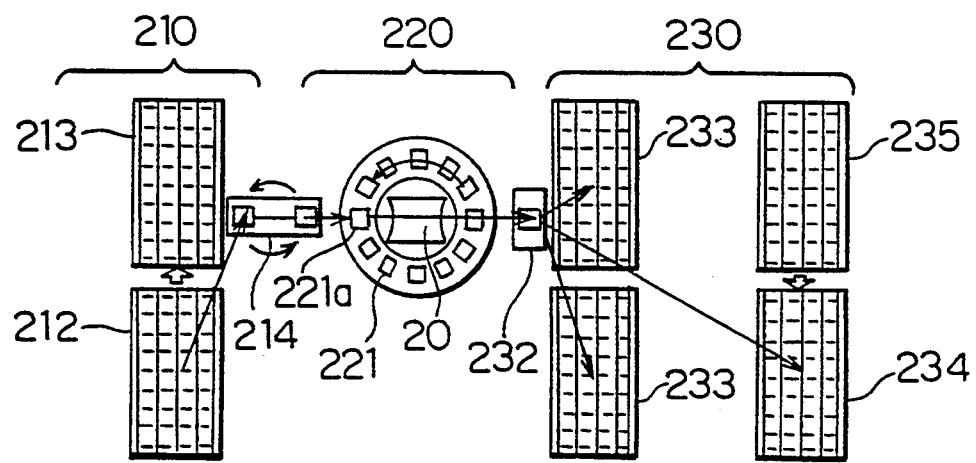
FIG. 23 is a schematic diagram of the internal construction of the semiconductor inspection system shown in FIG. 22.
Figure 24:
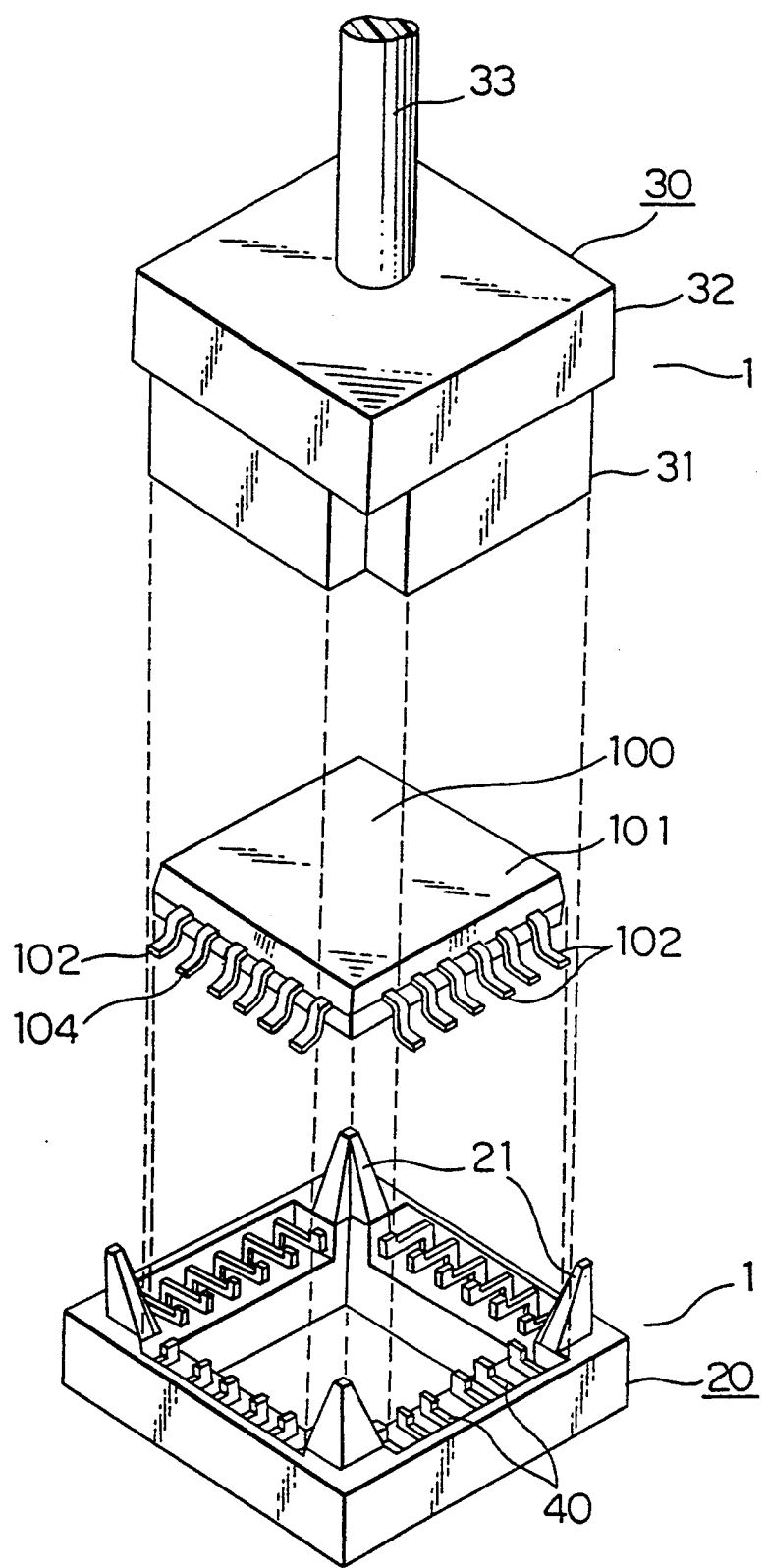
FIG. 24 is a perspective view of a conventional semiconductor inspection apparatus.
Figure 25:
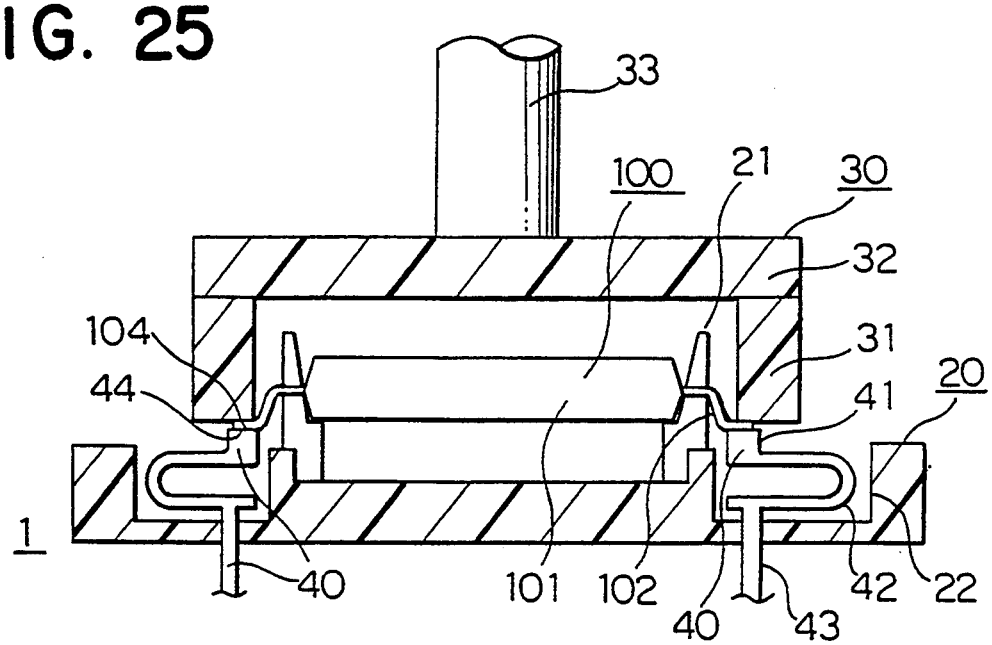
FIG. 25 is a cross-sectional view during inspection in the semiconductor inspection apparatus shown in FIG. 24.
Figure 26:
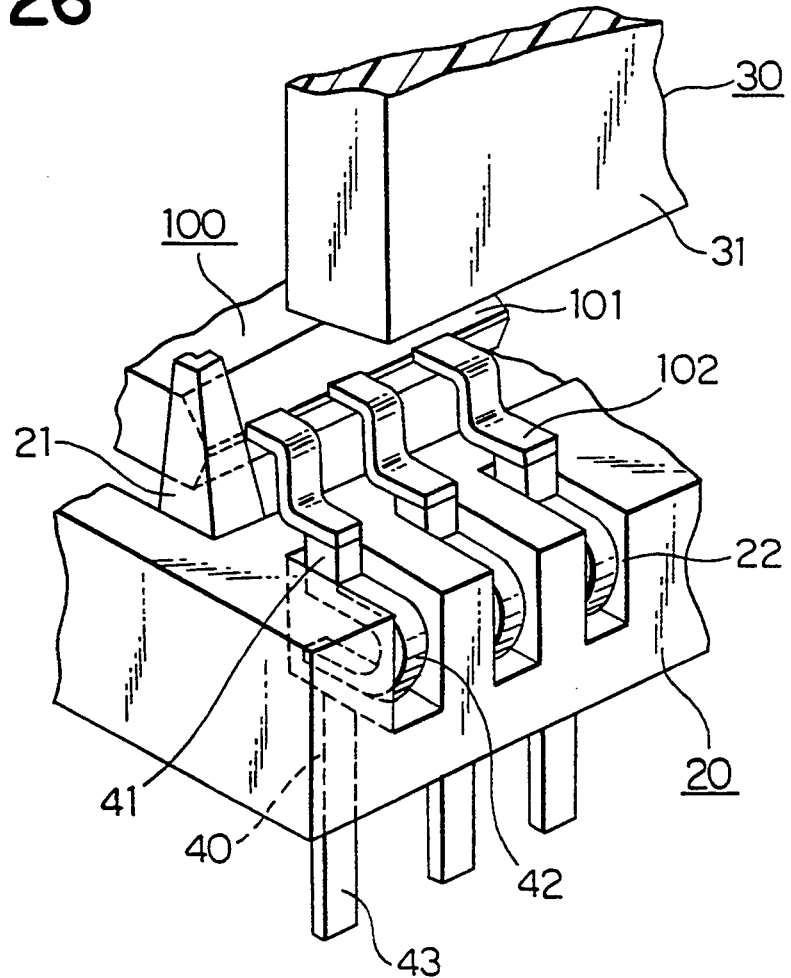
FIG. 26 is a perspective view of connected portions of contact terminals and external leads in the semiconductor inspection apparatus of FIG. 24.
Figure 27:
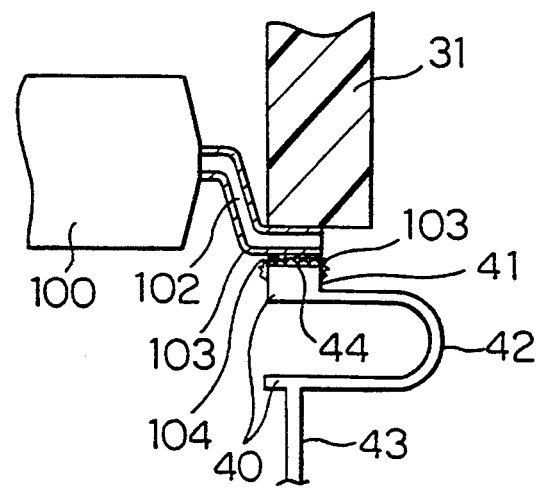
FIG. 27 is a cross-sectional view of a state of the semiconductor inspection apparatus of FIG. 24 in which solder is attached to and deposited on the contact terminals.

FIG. 12 schematically shows the internal construction of a semiconductor inspection system having a semiconductor inspection apparatus in accordance with the third embodiment in a measuring unit, and corresponds to FIG. 23 showing the internal construction of the above-described semiconductor inspection system. This inspection system differs from the system shown in FIG. 23 in that a sprocket mechanism 70, which is an automatic sheet changing means, is provided in the measuring unit 220a.

Figure 13:
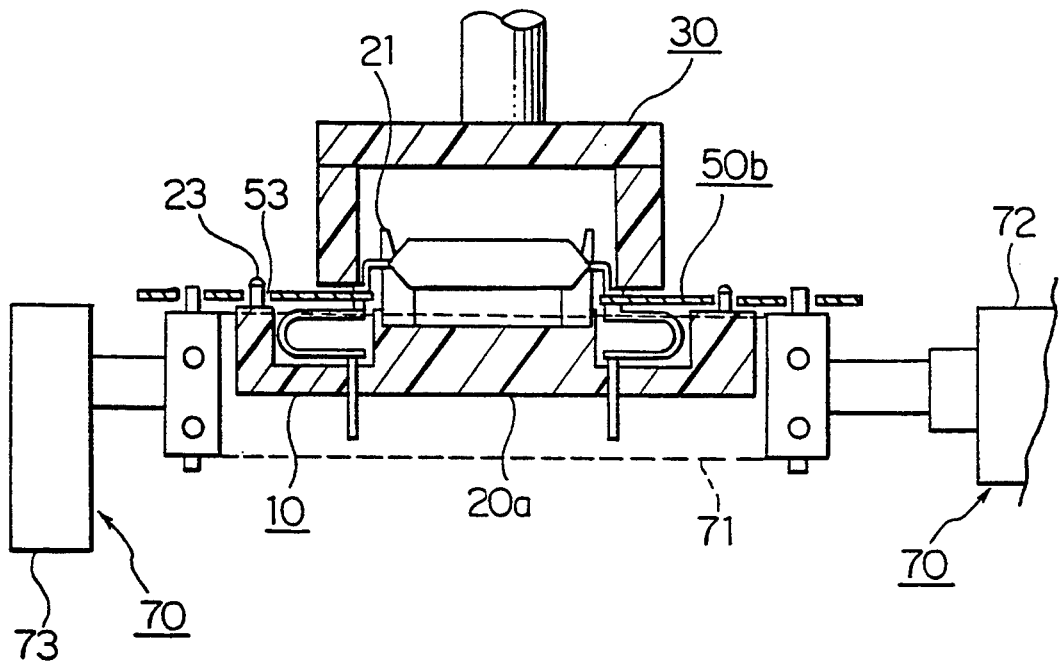
FIG. 13 is a cross-sectional view of the semiconductor inspection apparatus in accordance with the third embodiment.

FIG. 13 is a cross-sectional view of the semiconductor inspection apparatus having the sprocket mechanism 70 as an example of the automatic sheet changing means. As illustrated, a drum 71 is provided on the front side of the semiconductor inspection apparatus 10 to wind up a thin-film conductive sheet 50b. A motor 72 rotates the drum 71. A bearing 73 is provided in a position opposed to the motor 72. The drum 77 is illustrated only in outline to show components at the rear of the drum 71. A drum (not shown) for supplying the thin-film conductive sheet 50b is disposed on the side of the semiconductor inspection apparatus 10 remote from the drum 71. The sheet 50b is transferred in the direction from the reverse side to the obverse side of the paper on which FIG. 13 is printed paper.

Figure 14:
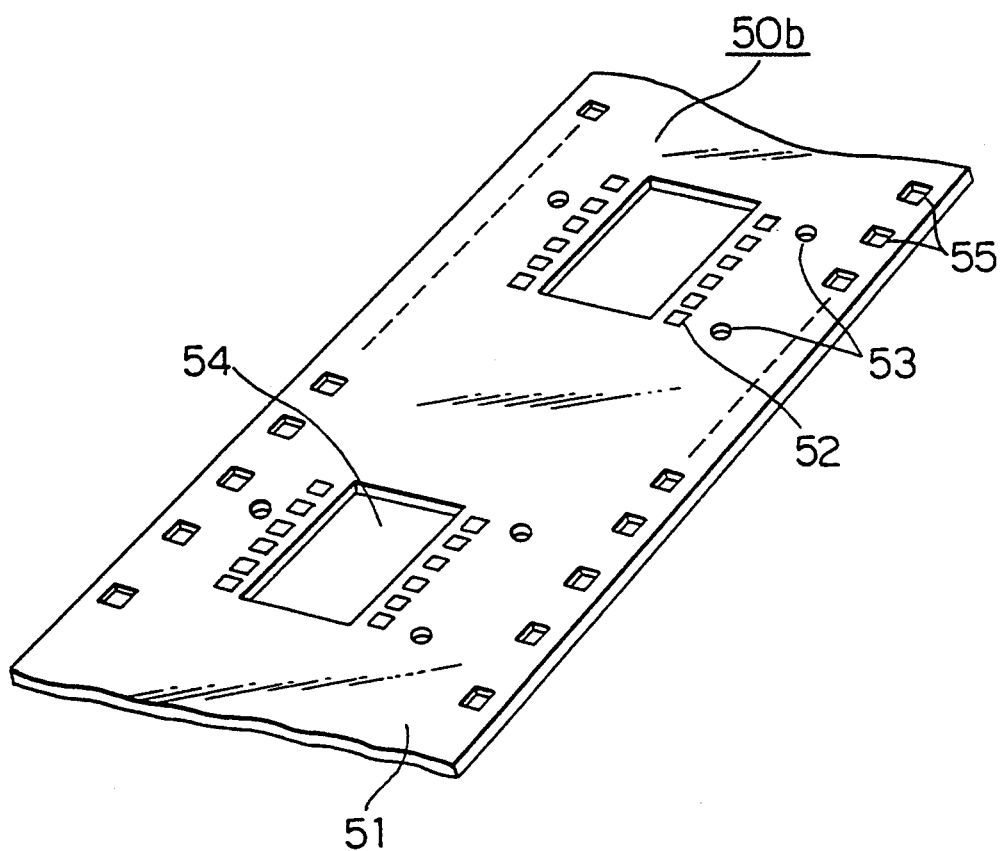
FIG. 14 is a perspective view of an example of a lengthwise thin-film conductive sheet used in the third embodiment.

In this embodiment, a continuous thin-film conductive sheet 50b having feed perforations 55 formed along two edges as shown in FIG. 14 is used. A predetermined length of the thin-film conductive sheet 50b is first fed by the sprocket mechanism 70 and is roughly positioned. The thin-film conductive sheet 50b is then positioned completely by means of the positioning holes 53 and the positioning pins 23 on the socket frame 20. The sprocket mechanism 70 is arranged to be movable in a vertical direction in the following manner. When the thin-film conductive sheet 50b is to be moved when the movable pressing device 30 is in an upper position, the sprocket mechanism 70 is moved upward to lift the thin-film conductive sheet 50b at least to a position above the guides 21 of the socket frame 20. After the sheet 50b has been moved through a predetermined distance, the sprocket mechanism 70 is returned to the illustrated state.

By the provision of the thus-arranged mechanism for automatically moving the thin-film conductive sheet 50b, the need for the manually of changing the thin-film conductive sheet is eliminated and operation efficiency can be further improved.

Embodiment 4

In the above-described embodiments, the external leads of the semiconductor device and the corresponding metal film patterns of the thin-film conductive sheet are positioned relative to each other by positioning the semiconductor device with the guides 21 of the semiconductor inspection apparatus. A fourth embodiment of the present invention will next be described in which the positions of metal film patterns on a thin-film conductive sheet are input as images and a semiconductor device is positioned relative to a thin-film conductive sheet on the basis of the input images.

Figure 15:
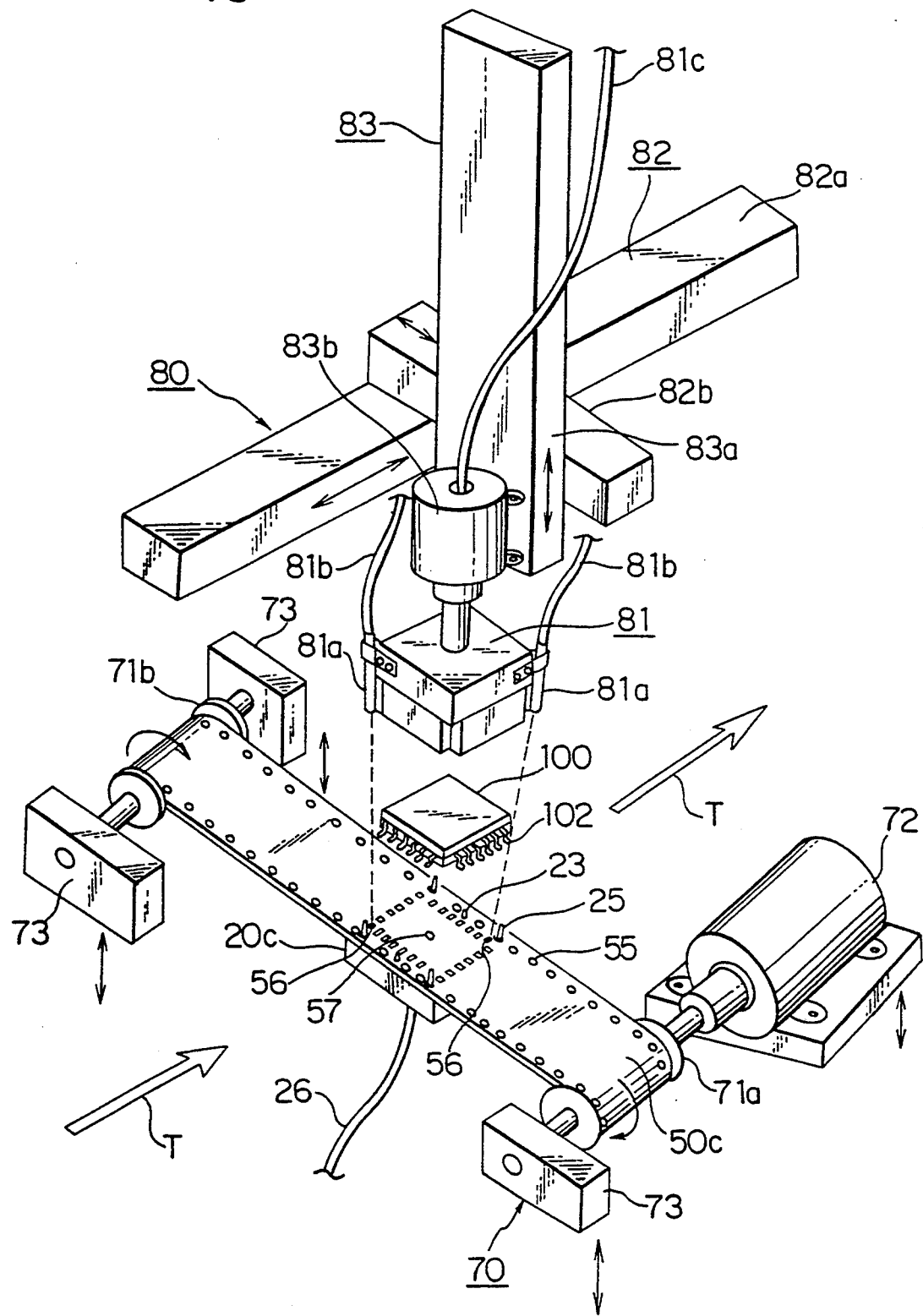
FIG. 15 is a perspective view of a semiconductor inspection apparatus in accordance with fourth to sixth embodiments of the present invention.
Figure 16A:
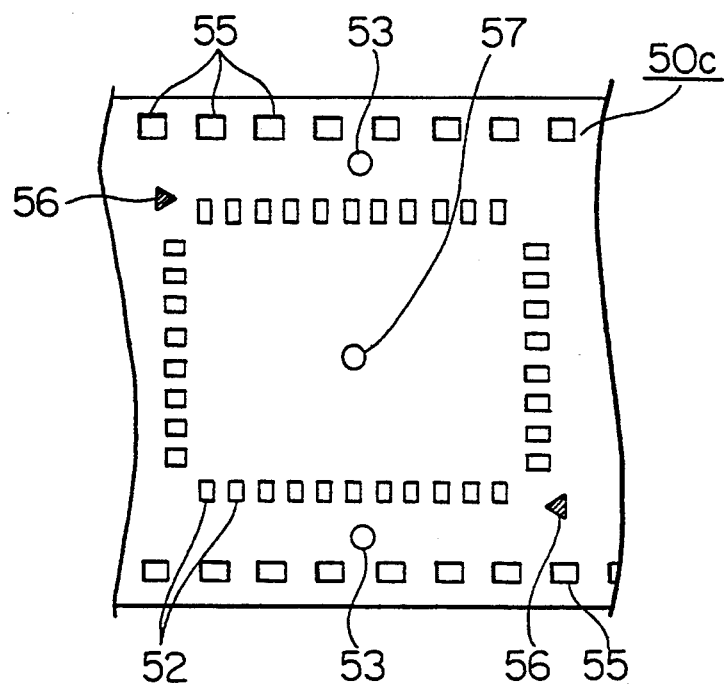
FIGS. 16A and 16B are partial plan views of lengthwise thin-film conductive sheets used in the fourth to sixth embodiments.
Figure 16B:
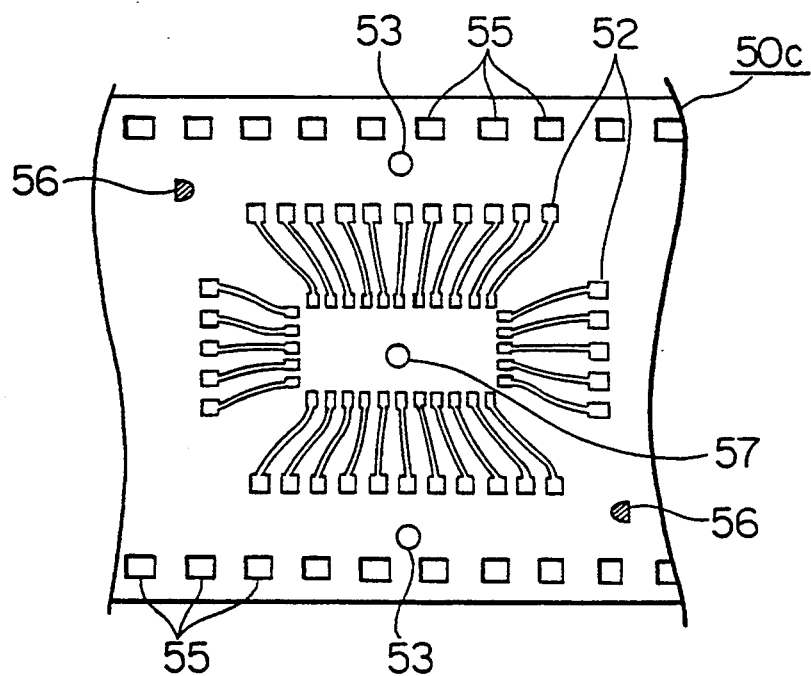

FIG. 15 is a perspective view of a semiconductor inspection apparatus in accordance with the fourth embodiment. FIGS. 16A and 16B are plan views of thin-film conductive sheets 50c of this embodiment; FIG. 16A is a plan view of the sheet in a case where external leads of a semiconductor device have the same pitch as contact terminals of a socket fame and FIG. 16B is a plan view of the sheet in a case where external leads have a pitch different from that of contact terminals.

A sprocket mechanism illustrated in FIG. 15 is basically the same as that illustrated in FIG. 13, and has a wind-up drum 71a and a supply drum 71b. When the thin-film conductive sheet 50c is fed, it is necessary to lift the sheet 50c through a predetermined distance. Accordingly, a motor 72 and a bearing 73 are movable in a vertical direction. A socket frame 20c of this embodiment differs from the socket frame 20a of FIG. 13 in that no guides 21 for positioning the semiconductor device 100 is provided. Accordingly, there are no need to provide aperture 54 (see Fig. 10) in the thin-film conductive sheet 50c, as shown in FIG. 16, while pins 25 for fixing the thin-film conductive sheet 50c by passing through feed perforations 55 of the sheet 50c are provided separately from positioning pins 23. The fixing pins 25 only serve to fix the sheet 50c and positioning of the sheet 50c on the socket frame 20c is actually performed by using the positioning pins 23 as in the above-described embodiments. A hole is formed in the socket frame 20c at a center thereof (at a position corresponding to a suction aperture of the sheet 50c) to fix the semiconductor device 100 on the socket frame A suction tube 26 is provided for this fixation.

A transport/positioning/pressing mechanism (hereinafter referred to a manipulator) 80 is provided above the socket frame 20c. The manipulator 80 has a head 81 for attracting the semiconductor device 100, and X-Y and Z-$\theta$ stages 82 and 83 for driving the head 81. The manipulator 80 performs aerial transport of the semiconductor device 100, positioning of the sheet 50c by image recognition and pressing of external leads 102 of the semiconductor device 100.

The head 81 serves to transport and position the semiconductor device 100 by holding the semiconductor device 100 and to downwardly press the external leads 102 of the semiconductor device 100 positioned on the socket frame 20c. Cameras 81a are provided which are positioning sensors for image recognition of positioning recognition marks 56 (see FIG. 16) on the thin-film conductive sheet 50c. Cables 81b are connected to the cameras 81a. A vacuum tube 81c is provided to apply a suction force for holding the semiconductor device 100 to a lower portion of the head 81. The X-Y stage 82 includes two arms 82a and 82b which are respectively moved in the directions of arrows by servo motors (not shown). The Z-$\theta$ stage 83 is attached to the X-Y stage 82 and includes of an arm 83a which is moved in the directions of arrows by a servo motor (not shown) and a $\theta$-direction drive servo motor 83b.

The thin-film conductive sheets 50c shown in FIGS. 16A and 16B have positioning recognition marks 56, and apertures 57 for fixing the semiconductor device 100 to the socket frame 20c through the sheet 50c. Other components of this embodiments are the same as those of the above-described embodiments.

Figure 17:
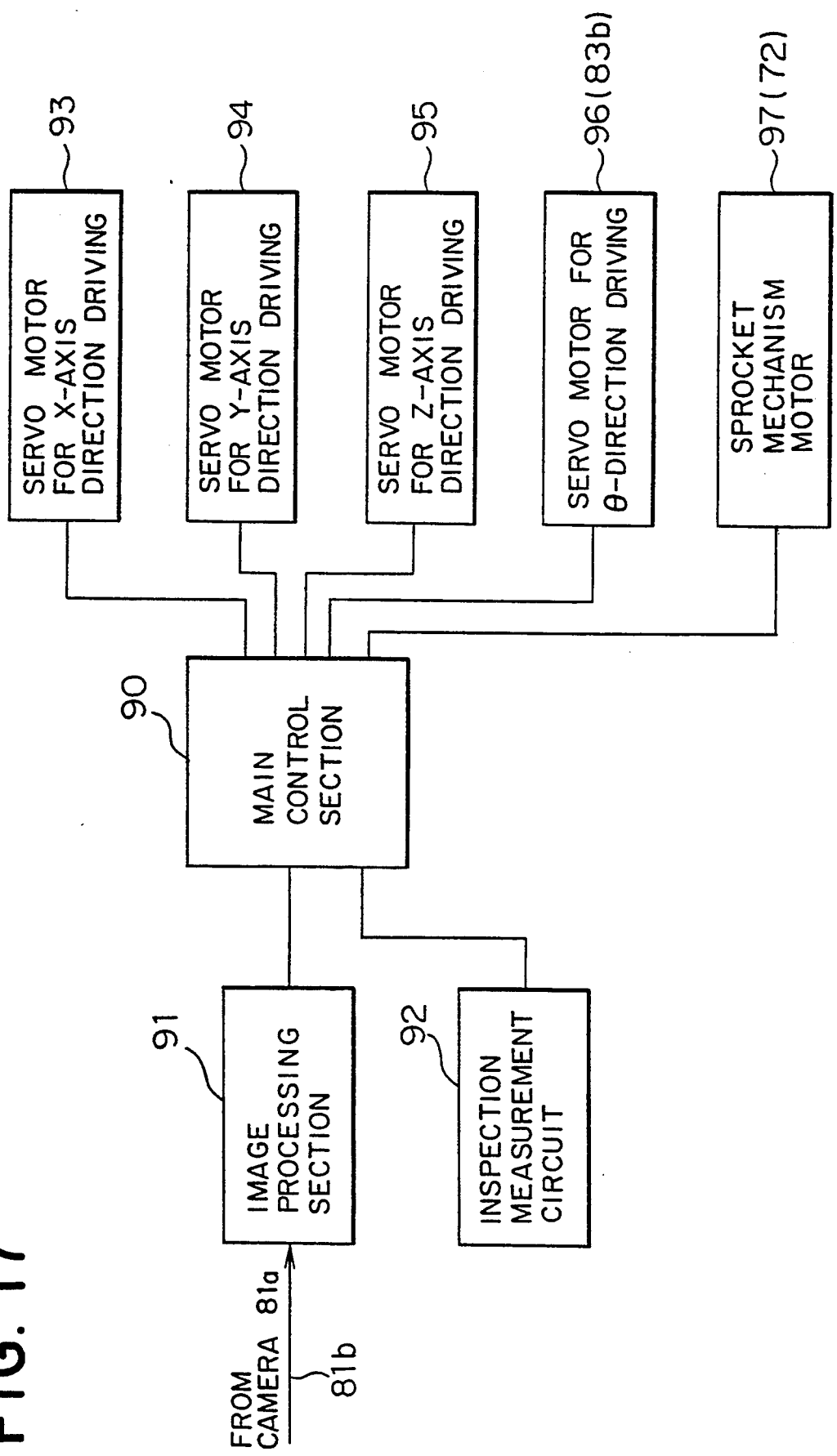
FIG. 17 is a block diagram of a control system of the semiconductor inspection apparatus in accordance with the fourth to sixth embodiments of the present invention.

FIG. 17 is a block diagram schematically showing the configuration of a control system for controlling the manipulator 80 and the sprocket mechanism 70. The control system has a main control section 90 formed of, for example, a microcomputer or the like for overall control of the manipulator 80, an image processing section 91 for processing signals from the cameras 81a attached to the head 81, a test measurement circuit 92 provided under the socket frame 20c (not shown in FIG. 15), servo motors 93 to 96 for driving in X-axis, Y-axis and $\theta$-directions, controlled by signals from the main control section 90 on the basis of signals output from the image processing section 91 (servo motor 96 corresponding to the servo motor 83b shown in FIG. 15), and a motor 97 for driving the sprocket mechanism 70 (corresponding to the motor 72 shown in FIG. 15).

The operation of this embodiment will be described with reference to FIGS. 15 to 17.

The thin-film conductive sheet 50c is fed in the direction of the arrow shown in FIG. 15 by the sprocket mechanism 70 if a used portion is contaminated by transfer and deposition of solder 103 from the external leads 102 of the semiconductor device 100 onto the metal film patterns 52. The motor 72 and the bearing 73 are lifted through a predetermined distance and maintained in the lifted state to feed the sheet 50c, since there are positioning pins 23 and fixing pins 25 on the socket frame 20c. Thereafter, the motor 72 and the bearing 73 are moved downward. Then, the sheet 50c is positioned on the socket frame 20c by means of the positioning pins 23 of the socket frame 20c and the positioning holes of the sheet 50c. This feeding of the sheet 50c is performed by counting the number of inspection times from a signal from the inspection measurement circuit 92 and by driving the sprocket mechanism motor 97 in accordance with the signal from the main control section 90 each time a predetermined number of times is reached.

Next, the manipulator 80 moves the semiconductor device 100, which is at the position 221a on the preliminary heating ring 221 shown in FIG. 12 although preliminary heating is completed, to a position above the thin-film conductive sheet 50c on the socket frame 20c in an aerial transport manner. When the manipulator 80 places the semiconductor device 100 on the sheet 50c, it positions the semiconductor device 100 so that the external leads 102 are aligned with the corresponding metal film patterns 52 on the sheet. For this positioning, the manipulator 80 forms images of the positioning recognition marks 56 through the cameras 81a to recognize the position of the sheet 50c and, hence, the positions of the metal film patterns 52, and operates the X-Y stage 82 and the Z-$\theta$ stage 83 on the basis of the recognition to adjust the position of the head 81 in the directions along X-, Y- and $\theta$-axes by the control system shown in FIG. 17, thereby positioning the semiconductor device 100 on the sheet 50c. This positioning is possible provided that the relative position accuracy of the metal film patterns 52 and the recognition marks 56 of the sheet 50c is sufficiently high.

When the semiconductor device 100 is positioned on the sheet 50c, the semiconductor device held to the head 81 is fixed to the socket frame 20c through the sheet 50c by the vacuum applied through the hole 57.

Next, the manipulator 80 drives the arms 83a of the Z-$\theta$ stage 83 in the direction along the Z-axis to press the external leads 102 of the semiconductor device 100 against the metal film patterns 52 of the sheet 50c. In this state, desired inspection tests such as a screening test and a burn-in test are performed. The semiconductor device 100 having undergone the inspection is attracted again to the head 81 of the manipulator 80 to be moved to the recovery table 232 shown in FIG. 12 in an aerial transport manner. Thereafter, the manipulator 80 starts transporting the next semiconductor device 100 located at the position 221a on the preliminary heating ring 221 and having undergone preliminary heating, and repeats the above-described operations. Each time the inspection of a predetermined number of semiconductor devices 100 is completed, the above-described operation of feeding the sheet 50c is performed.

Thus, in this embodiment, errors in positioning of the semiconductor device 100 with respect to the transport distances (in X-Y directions) and the rotation (in $\theta$-direction) are corrected upon the recognition of the position through images, thereby enabling a semiconductor device having a lead pitch of 0.5 mm or smaller to be accurately positioned relative to the sheet. Also, since the semiconductor device placed on the sheet is fixed, there is substantially no possibility of occurrence of a positioning error after positioning, and the semiconductor device can be inspected with improved accuracy.

The positioning sensor, described above as camera 81a, may alternatively be a reflection type optical sensor or the like having light emitting and light receiving portions and capable of detecting light reflected from a target and emitted by the sensor.

Embodiment 5

Figure 18A:
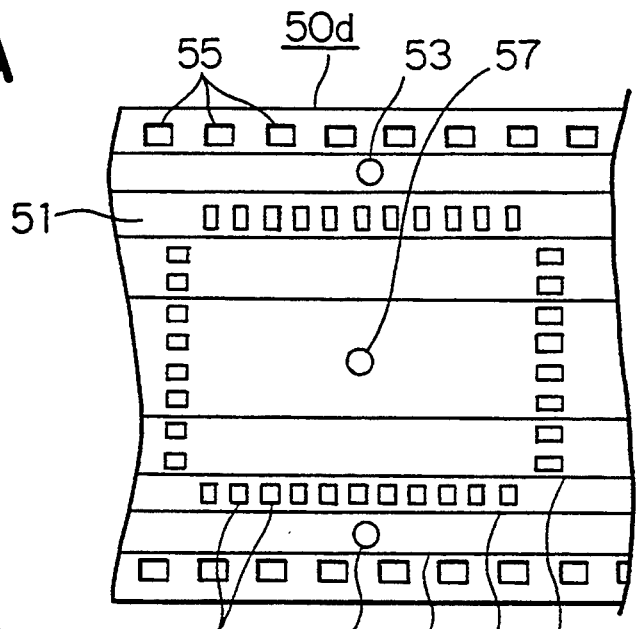
FIGS. 18A and 18B are a partial plan view and a partial cross-sectional view, respectively, of a lengthwise thin-film conductive sheet used in the semiconductor inspection apparatus of the fifth embodiment of the present invention.
Figure 18B:
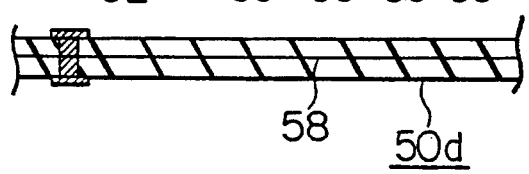
Figure 19A:
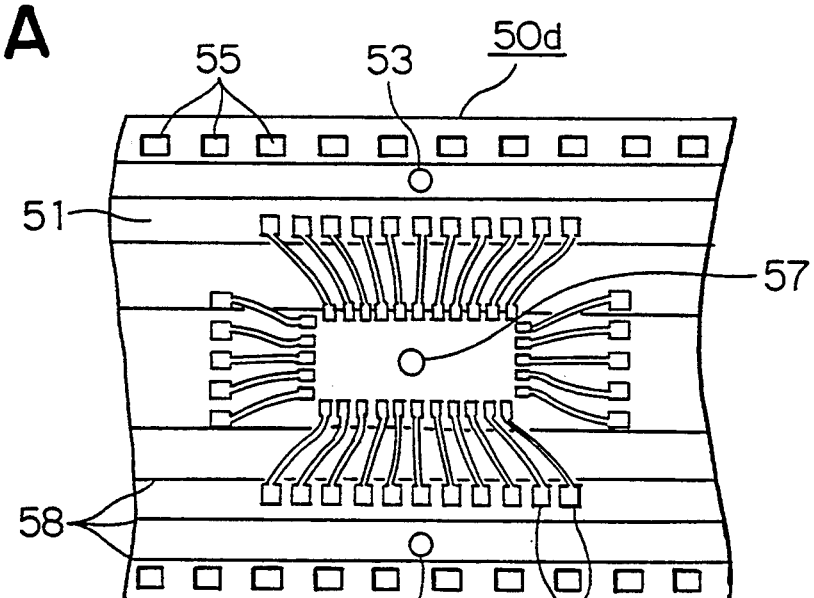
FIGS. 19A and 19B are a partial plan view and a partial cross-sectional view, respectively, of another lengthwise thin-film conductive sheet used in the semiconductor inspection apparatus of the fifth embodiment of the present invention.
Figure 19B:
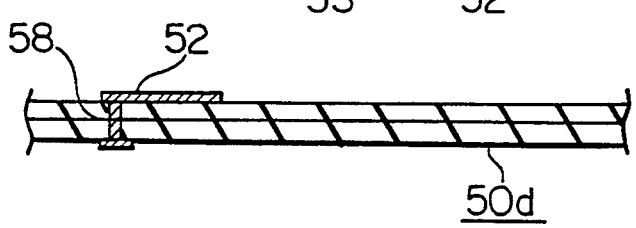

The mechanical strength of the thin film conductive sheet is not high enough for reliable operation because of its small thickness. Particularly during inspection, the sheet is influenced by a high temperature. Further, the sheet is tensioned if it is fed by a sprocket mechanism or the like as in Embodiments 3 and 4. In such situations, mechanical strength is particularly important. A fifth embodiment of the present invention relates to a thin-film conductive sheet having improved mechanical strength. FIGS. 18A, 18B, 19A, and 19B show thin-film conductive sheets of the fifth embodiment. FIG. 18A and 18B illustrate, in plan and section, respectively, a sheet used in a case where an array of external leads of a semiconductor device and an array of contact terminals on a socket frame have equal pitches. FIG. 19A and 19B illustrate, in plan and section, respectively, a sheet used in a case where an array of external leads and array of contact terminals have different pitches. In the sheet 50d of this embodiment, a thin-film insulating sheet 51 is formed of a heat resistant resin such as polyimide, and wires (thin metallic wires) 58 are embedded in the insulating sheet so as to extend in the lengthwise direction of the sheet. The embedded wires 58 are prevented from contacting metal film patterns and through hole portions. The diameter of the wire 58 is, desirably, 0.1 mm or smaller, for example. It is preferable to select the material of the wires 58 from materials having a thermal expansion coefficient substantially equal to that of the material of the thin-film insulating sheet 51, i.e., polyimide or the like. For example, such materials are titanium, molybdenum, tungsten, and stainless steel.

The thin-film conductive sheet 50d can be reinforced in this manner and prevented from partially deforming and becoming non-planar in response to a tensile load applied during feeding with the sprocket mechanism. Thus, the desired planarity of the sheet can be maintained.

Embodiment 6

Figure 20A:
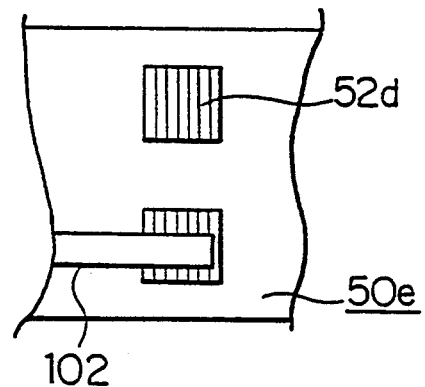
FIGS. 20A and 20B are a partial plan view and a partial sectional view, respectively, of a lengthwise thin-film conductive sheet used in the semiconductor inspection apparatus of the sixth embodiment of the present invention, showing a state of the sheet at an initial stage of use.
Figure 20B:
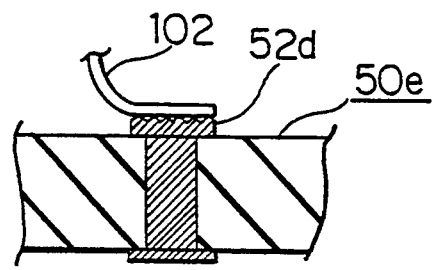
Figure 21A:
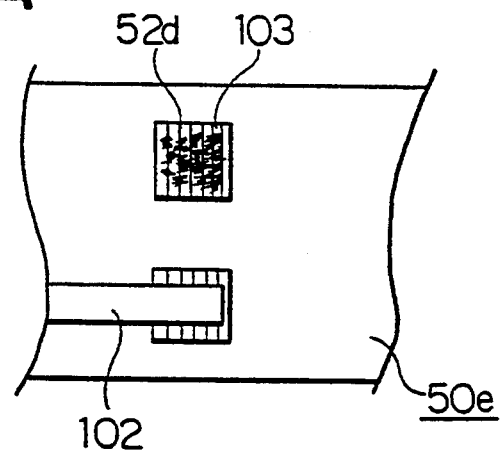
FIGS. 21A and 21B are a partial plan view and a partial sectional view, respectively, of a lengthwise thin-film conductive sheet used in the semiconductor inspection apparatus of the sixth embodiment of the present invention, showing a state when the sheet is to be changed.
Figure 21B:
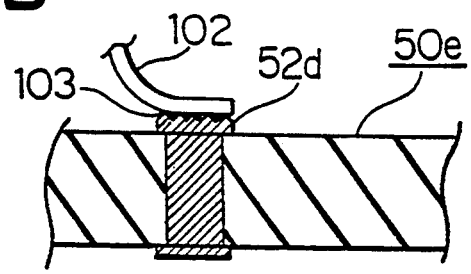

In Embodiments 3 and 4, the thin-film conductive sheet is changed, for example, by counting the number of inspection times and changing the sheet each time a predetermined number of inspection times is reached. In a sixth embodiment of the present invention, a sheet change designation mark for designating the time to change a thin-film conductive sheet is provided on the sheet. FIGS. 20A and 20B show a state of a thin-film conductive sheet 50e of this embodiment at an initial stage of use. FIG. 20A is a partial plan view and FIG. 20B is a partial sectional view. In this embodiment, as illustrated, metal film patterns 52 of the thin-film conductive sheet 50e are formed so as to have a sawtooth-like surface profile having acute peaks. The surface of each metal film pattern formed in this manner is used as a sheet change designation mark. The surface formed in this manner exhibits a striped pattern when viewed in plan. FIGS. 21A and 21B illustrate a thin-film conductive sheet 50e to be changed. FIG. 21A is a partial plan view and FIG. 21B is a partial sectional view. As illustrated, as the number of inspection times is increased, solder 103 transferred from external leads 102 is attached to and accumulated in grooves in the surface of the metal film patterns 52d.

The striped pattern of each metal film pattern 52s is observed by, pattern recognition with cameras 81a shown in FIG. 15. If no striped pattern is recognized, a sheet change signal, for example, is supplied from the image processing section 91 to the main control section 90 in the system shown in FIG. 17. The sprocket mechanism drive motor 97 is driven on the basis of this signal and under the control of the main control section 90, thereby automatically changing the sheet.

As described above, the metal film patterns 52d have a sawtooth-like surface to form a sheet to form a sheet change designation mark for designating the time to change the sheet. If the sheet is changed according to the state of this mark, the possibility of the sheet being wasted by an excessively early change is reduced in comparison with the method of changing the sheet in cycles in accordance with a predetermined number of inspection times, while the sheet can be prevented from being used in a seriously contaminated state. It is therefore possible to change the sheet in a more suitable condition. Further, if the metal film patterns have a sawtooth-like profile, the effect of wiping the surfaces of the external leads 102 can be improved so that the external leads 102 and metal film patterns 52b can contact each other more reliably.

The surface profile of the metal film patterns of this embodiment is not limited to the sawtooth profile. Any other surface profiles may be used to achieve the same effect, as long as the sheet change mark pattern disappear upon attachment and deposition of the solder from the external leads.

As described above, in the semiconductor inspection apparatus provided in the first aspect of the invention, in which each semiconductor device is placed on the socket frame having contact terminals connected to an inspection measurement circuit, and in which the semiconductor device is inspected while external leads of the semiconductor device are being pressed against the contact terminals, a thin-film conductive sheet is interposed between the external leads of the semiconductor device and the contact terminals of the socket frame. The external leads and the contact terminals are electrically connected to each other through conductor patterns on the thin-film conductive sheet without directly contacting each other. Accordingly, it is possible to prevent product failures, such as contact failure and deformation of mounted surfaces of the external leads caused by solder transferred from the external leads, by changing the thin-film conductive sheet to which the solder from the external lead surfaces attaches. Also, the need for troublesome cleaning or changing the contact terminals as in the case of the conventional apparatus is eliminated. Consequently, a semiconductor inspection apparatus capable of inspecting semiconductor devices with improved reliability and having an improved operation efficiency can be provided.

In the second aspect of the invention, if the array of external leads of the semiconductor device and the array of contact terminals on the socket frame differ from each other in position and pitch, a thin-film conductive pattern is used which has two groups of metal film patterns corresponding respectively to the external leads and the contact terminals, and metal film extension patterns which connect the two groups of metal film patterns, thereby making it possible to increase the external lead pitch on the contact terminal side. Consequently, a semiconductor inspection apparatus for inspection of, for example, semiconductor devices having external leads of a very small pitch as well as achieving the above-mentioned effects is provided.

In the third aspect of the invention, a mechanism for automatically changing the thin-film conductive sheet is further provided. A semiconductor inspection apparatus having an improved operation efficiency can be provided by adopting such means.

In the fourth aspect of the invention, wires are embedded in the thin-film conductive sheet to improve the mechanical strength of the sheet. In particular, in a case where a lengthwise thin-film conductive sheet is changed automatically by being fed by a sprocket mechanism, the sheet can be prevented from being elongated by a tensile load during feeding of the sprocket mechanism. Also, the desired flatness of the sheet can be maintained. Thus, a more reliable semiconductor inspection apparatus can be provided.

In the fifth aspect of the invention, a positioning sensor for taking in an image of the recognition marks provided on the thin-film conductive sheet for positioning of the semiconductor device relative to the thin-film conductive sheet is provided on the head portion of the manipulator for performing aerial transport, positioning on the thin-film conductive sheet and pressing during inspection of the semiconductor device by holding the semiconductor device against the head portion. The manipulator is arranged to position the semiconductor device on the basis of the position of the positioning recognition marks. After the semiconductor device has been positioned on the thin-film conductive sheet on the socket frame, it is fixed on the socket frame. Therefore, the semiconductor device can be positioned on the thin-film conducive sheet with improved accuracy and can be prevented from being shifted from the correct position after positioning. It is therefore possible to accurately position even semiconductor devices having external leads of, a very small pitch. Consequently, a semiconductor inspection apparatus having further improved reliability is provided.

In the sixth aspect of the invention on the basis of the apparatus in the fifth aspect, sheet change designation marks having a surface profile having smaller recesses and projections which can disappear gradually as the solder from the external leads is attached to and deposited thereon are further formed in portions of the conductor patterns of the thin-film conductive sheet which the external leads of the semiconductor device contact. An image of the sheet change designation marks is also input by the positioning sensor, while the manipulator is driven according to the position of the positioning recognition marks to position the semiconductor device on the thin-film conductive sheet. When the sheet change designation marks become unrecognizable with the sensor, the sprocket mechanism is driven to feed and change the thin-film conductive sheet, thereby enabling the sheet to be changed in a more suitable condition (just when utilized fully). Consequently, an economical semiconductor inspection apparatus capable of operating with improved reliability without wasting the sheet can be provided.

What is claimed is:

1. An apparatus for testing semiconductor devices comprising:
    a socket frame on which a semiconductor devices is individually supported during testing and including an array of contact terminals corresponding to an array of external leads of a semiconductor device and connected to a test measurement circuit a movable pressing device for pressing the external leads of a semiconductor device supported on said socket frame toward the contact terminals during testing; and a changeable sheet having a plurality of conductor patterns for electrically connecting the external leads of the semiconductor device and the contact terminals of said socket frame, said sheet being interposed between the contact terminals and the external leads during inspection of a semiconductor devices during testing for preventing solder on the external leads from attaching to and depositing on the contact terminals.

2. The apparatus for testing semiconductor devices according to claim 1 wherein the conductor patterns of said sheet are first metal film patterns arranged with a pitch equal to a pitch of the array of external leads of the semiconductor device, second metal film patterns arranged with a pitch equal to a pitch of the array of contact terminals, and metal film extension patterns connecting said first and second metal film patterns, whereby said sheet can connect external leads of the semiconductor device and the array of contact terminals on said socket frame that differ in position and pitch.

3. The apparatus for testing semiconductor devices according to claim 1 wherein said sheet is a lengthwise sheet including and a sprocket mechanism for automatically changing a used portion of the sheet in a feed operation.

4. The apparatus for testing semiconductor devices according to claim 3 wherein wires are embedded in said lengthwise sheet to improve mechanical strength of the sheet.

5. An apparatus for testing semiconductor devices comprising:

a socket frame for fixedly holding a semiconductor device and including an array of contact terminals corresponding to external leads of the semiconductor device and connected to a test measurement circuit a changeable lengthwise sheet having a plurality of conductor patterns for electrically connecting the external leads of the semiconductor device and the contact terminals of said socket frame, said sheet being interposed between the contact terminals and the external leads during inspection of a semiconductor device during testing for preventing solder on the external leads from attaching to and depositing on the contact terminals;

positioning recognition marks on said sheet for positioning the semiconductor device;

a sprocket mechanism for automatically changing said lengthwise sheet in a feed operation;

a manipulator for moving the semiconductor device to a position above said sheet on said socket frame, said manipulator having a head for holding the semiconductor device for positioning the semiconductor device on said sheet, for pressing the external leads of the semiconductor device toward the contact terminals during testing, and for removing the semiconductor device from said sheet while holding the semiconductor device to the head after testing;

at least one positioning sensor attached to the head of said manipulator to form an image of each of said positioning recognition marks on said sheet; and a control unit for driving said sprocket mechanism to feed and change said sheet in response to signals from said positioning sensor and the test measurement circuit after a fixed number of tests counted from a signal generated by the test measurement circuit and for driving said manipulator to position the semiconductor device on said sheet in response to a signal from said positioning sensor.

6. An apparatus for testing semiconductor devices comprising:

a socket frame for fixedly holding a semiconductor device and including an array of contact terminals corresponding to external leads of the semiconductor device and connected to a test measurement circuit;

a changeable lengthwise sheet having a plurality of conductor patterns for electrically connecting the external leads of the semiconductor device and the contact terminals of said socket frame, said sheet being interposed between the contact terminals and the external leads during inspection of a semiconductor device during testing for preventing solder on the external leads from attaching to and depositing on the contact terminals;

positioning recognition marks on said sheet for positioning the semiconductor device;

sheet change designation marks in portions of the conductor patterns of said sheet contacting the external leads of the semiconductor device, each sheet change designation mark having a surface profile including small recesses and projections that disappear gradually as solder from the external leads is attached to and deposited thereon;

a sprocket mechanism for automatically changing said lengthwise sheet in a feed operation;

a manipulator for moving the semiconductor device to a position above said sheet on said socket frame, said manipulator having a head for holding the semiconductor device, for positioning the semiconductor device on said sheet, for pressing the external leads of the semiconductor device toward the contact terminals during testing, and for removing the semiconductor device from said sheet while holding the semiconductor device to the head after testing;

at least one positioning sensor attached to the head of said manipulator to form an image of each of said positioning recognition marks on said sheet; and a control unit for driving said sprocket mechanism to feed and change said sheet in response to a signal from said positioning sensor when said sheet change designation marks become unrecognizable and for driving said manipulator to position the semiconductor device on said sheet in response to the position of said positioning recognition marks.

7. The apparatus for testing semiconductor devices according to claim 1 wherein the socket frame includes guides for supporting a body of a packaged semiconductor device.

8. The apparatus for testing semiconductor devices according to claim 7 wherein the sheet includes a hole for passage of guides for contacting the body of the packaged semiconductor device.

9. The apparatus for testing semiconductor devices according to claim 1 wherein the pressing device and the contact terminals are disposed on opposite sides of the sheet.

10. The apparatus for testing semiconductor devices according to claim 1 wherein the external leads and the contact terminals are disposed on opposite sides of the sheet.

11. The apparatus for testing semiconductor devices according to claim 1 wherein the pressing device has an electrically insulating pressing portion for contacting the external leads of the semiconductor device.

12. The apparatus for testing semiconductor devices according to claim 1 wherein the external leads are unconnected to the sheet.

13. The apparatus for testing semiconductor devices according to claim 1 wherein the socket frame includes a positioning projection for positioning the sheet with respect to the contact terminals, and the sheet includes a positioning hole for receiving the positioning projection.

14. The apparatus for testing semiconductor devices according to claim 1 wherein the sheet includes conductor patterns corresponding to the external leads of only a single semiconductor device.

* * * * *

UNITED STATES PATENT AND TRADEMARK OFFICE
CERTIFICATE OF CORRECTION

PATENT NO. : 5,444,388  
DATED : August 22, 1995  
INVENTOR(S) : Ideta et al.

It is certified that error appears in the above-indentified patent and that said Letters Patent is hereby corrected as shown below:

Title page, Item [30], change date "Apr. 5, 1992" to --Apr. 5, 1993--;

Column 18, Line 64, delete "a" (second occurrence);

Line 64, change "is" to --are--;

Line 68, after "circuit" insert --;--;

Column 19, Line 2, change "a" to --the--;

Line 11, change "devices" to --device--;

Line 23, change "and the array of" to --to--;

Line 28, change "including and" to -- and including--;

Line 41, after "circuit" insert --;--;

UNITED STATES PATENT AND TRADEMARK OFFICE
CERTIFICATE OF CORRECTION

PATENT NO. : 5,444,388
DATED : August 22, 1995
INVENTOR(S) : Ideta, et. al.

It is certified that error appears in the above-indentified patent and that said Letters Patent is hereby corrected as shown below:

Line 59, after "device" insert -- , --.

Signed and Sealed this

Fourth Day of June, 1996

Attest:

BRUCE LEHMAN

Attesting Officer        Commissioner of Patents and Trademarks